(12) United States Patent
Otake et al.

(10) Patent No.: US 11,462,635 B2
(45) Date of Patent: Oct. 4, 2022

(54) NITRIDE SEMICONDUCTOR DEVICE AND METHOD OF MANUFACTURING THE SAME

(71) Applicant: ROHM CO., LTD., Ukyo-ku Kyoto (JP)

(72) Inventors: Hirotaka Otake, Ukyo-ku Kyoto (JP); Shinya Takado, Ukyo-ku Kyoto (JP); Kentaro Chikamatsu, Ukyo-ku Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/699,287

(22) Filed: Nov. 29, 2019

(65) Prior Publication Data
US 2020/0176595 A1    Jun. 4, 2020

(30) Foreign Application Priority Data

Nov. 30, 2018  (JP) .............................. JP2018-225694

(51) Int. Cl.
*H01L 29/66* (2006.01)
*H01L 29/778* (2006.01)
*H01L 29/20* (2006.01)

(52) U.S. Cl.
CPC ...... *H01L 29/7787* (2013.01); *H01L 29/2003* (2013.01); *H01L 29/66431* (2013.01); *H01L 29/66462* (2013.01)

(58) Field of Classification Search
CPC combination set(s) only.
See application file for complete search history.

(56) References Cited

U.S. PATENT DOCUMENTS

| 2003/0010993 A1* | 1/2003 | Nakamura | ............... H01L 33/32 |
| | | | 257/99 |
| 2006/0043419 A1* | 3/2006 | Tachibana | ............. C30B 29/406 |
| | | | 257/E29.317 |

(Continued)

FOREIGN PATENT DOCUMENTS

| JP | 2013207102 A | 10/2013 |
| JP | 2017073506 | 4/2017 |

(Continued)

OTHER PUBLICATIONS

Notice of Reasons for Refusal issued in corresponding Japanese Application No. 2018-225694, dated Aug. 4, 2022, with machine translation.

*Primary Examiner* — Moin M Rahman
(74) *Attorney, Agent, or Firm* — Hamre, Schumann, Mueller & Larson, P.C.

(57) ABSTRACT

There is provided a nitride semiconductor device that includes a first nitride semiconductor layer configured as an electron transit layer, a second nitride semiconductor layer formed on the first nitride semiconductor layer and configured as an electron supply layer, a ridge-shaped nitride semiconductor gate layer disposed on the second nitride semiconductor layer and including an acceptor-type impurity, and a gate electrode formed on the nitride semiconductor gate layer. The gate electrode includes a first metal film that is formed on the nitride semiconductor gate layer and is mainly made of Ti, and a second metal film that is formed on the first metal film and is made of TiN.

11 Claims, 21 Drawing Sheets

(56) References Cited

U.S. PATENT DOCUMENTS

| | | | |
|---|---|---|---|
| 2015/0061041 A1* | 3/2015 | Lin | H01L 29/66545 257/410 |
| 2017/0104091 A1* | 4/2017 | Tanaka | H01L 29/66431 |
| 2018/0218910 A1* | 8/2018 | Harada | H01L 29/0684 |

FOREIGN PATENT DOCUMENTS

| | | |
|---|---|---|
| JP | 2018182247 A | 11/2018 |
| WO | 2017051530 A1 | 3/2017 |

\* cited by examiner

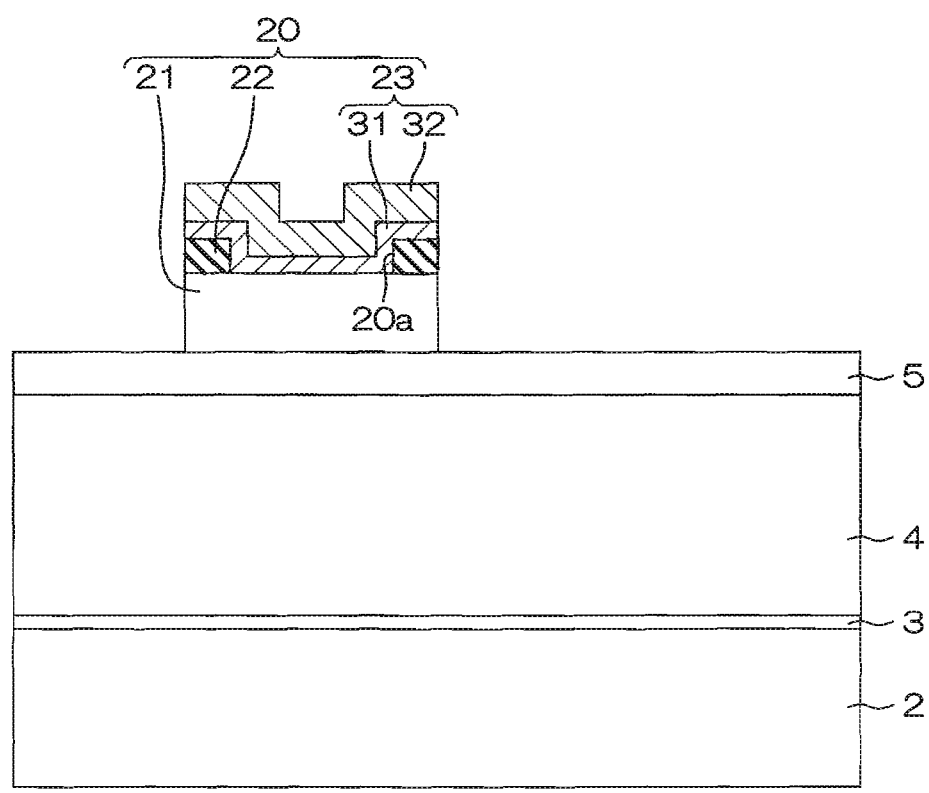

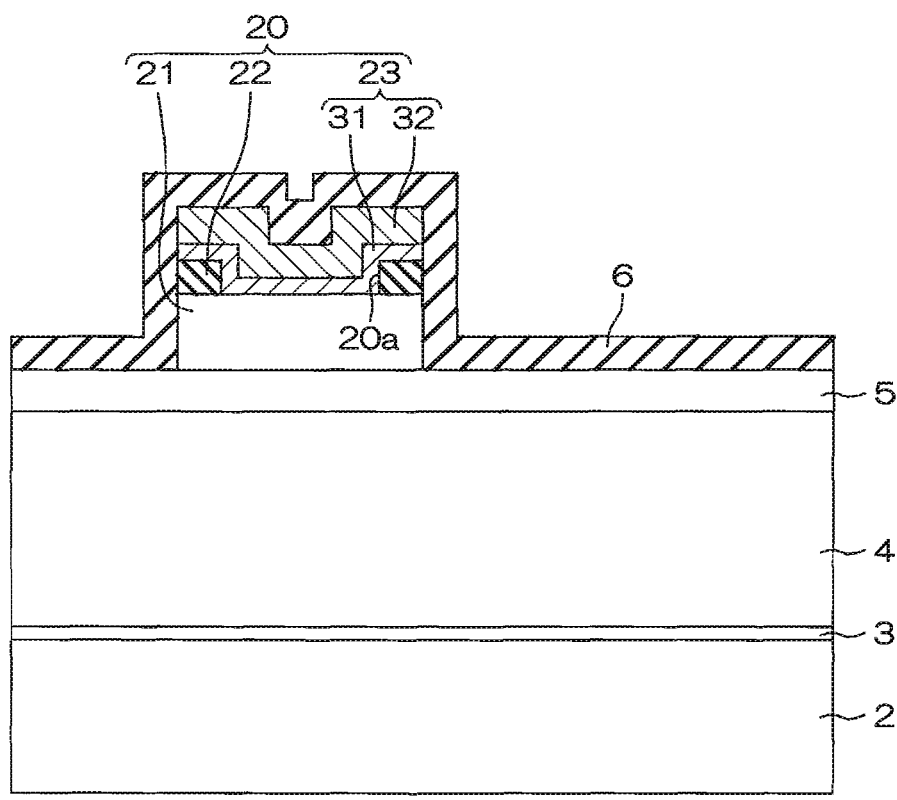

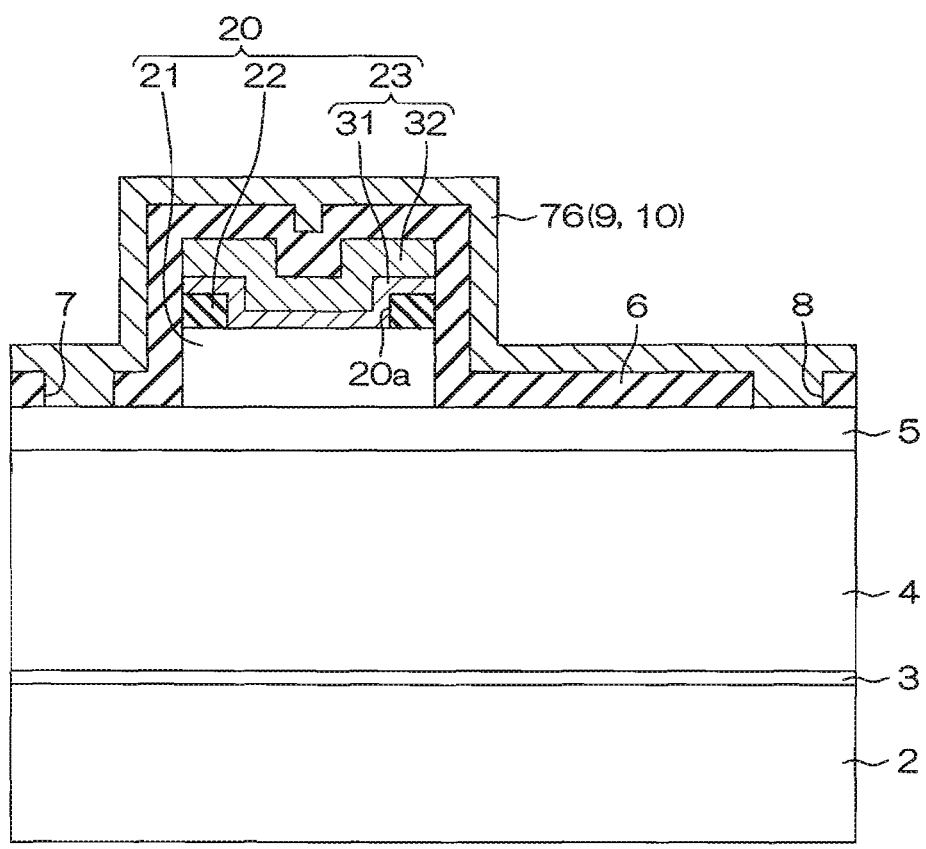

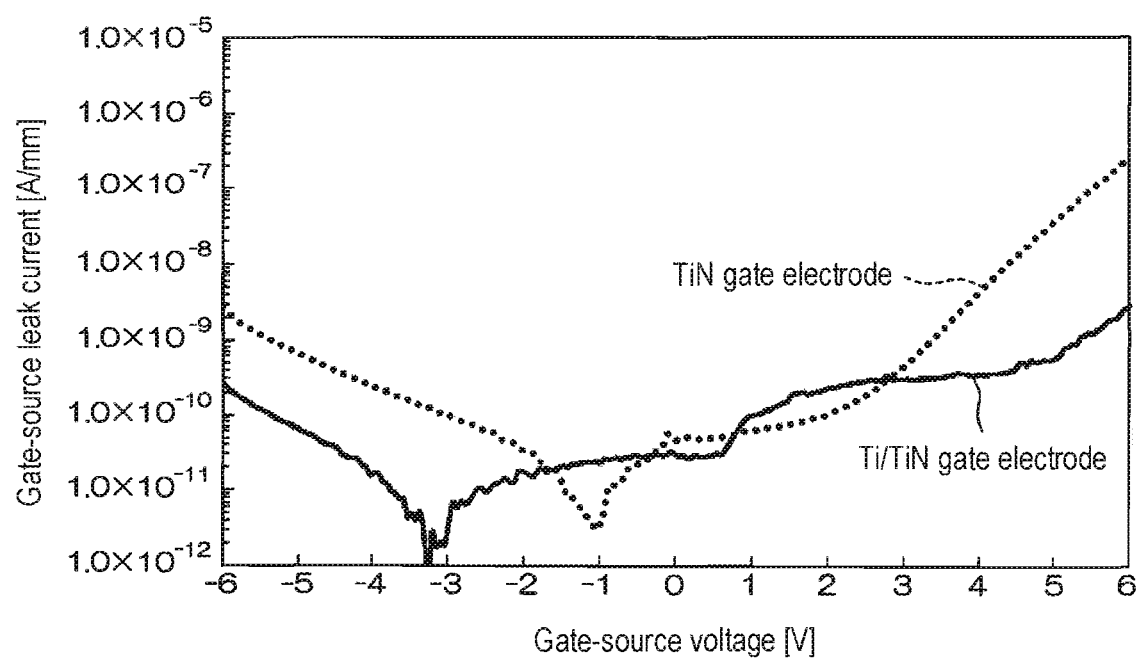

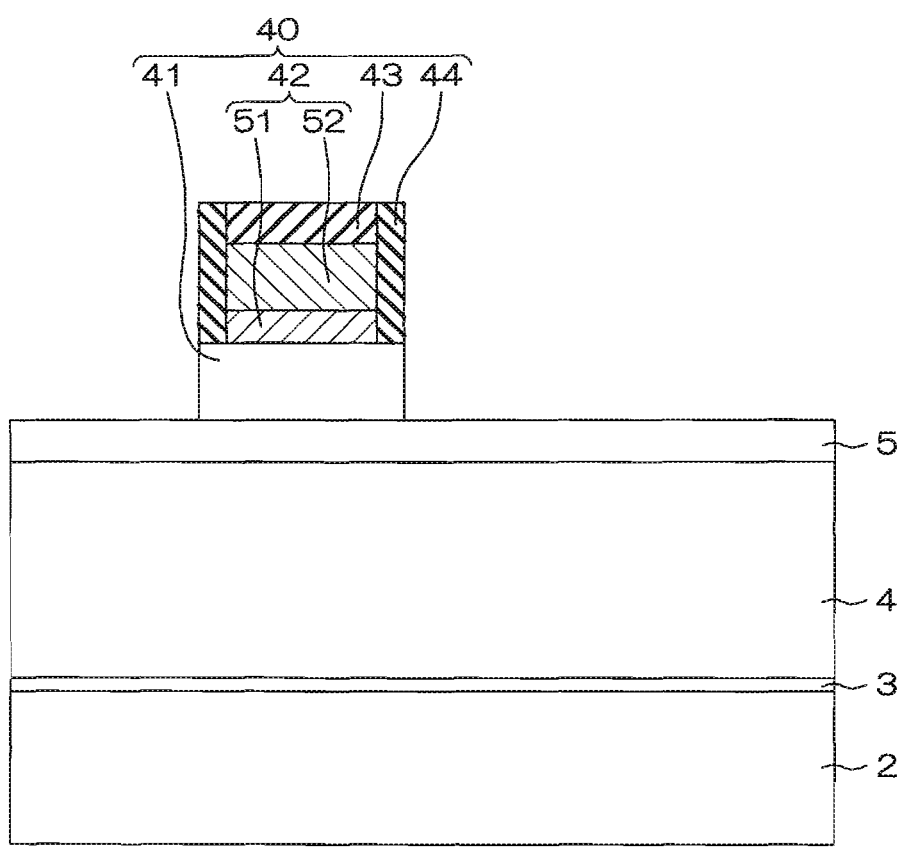

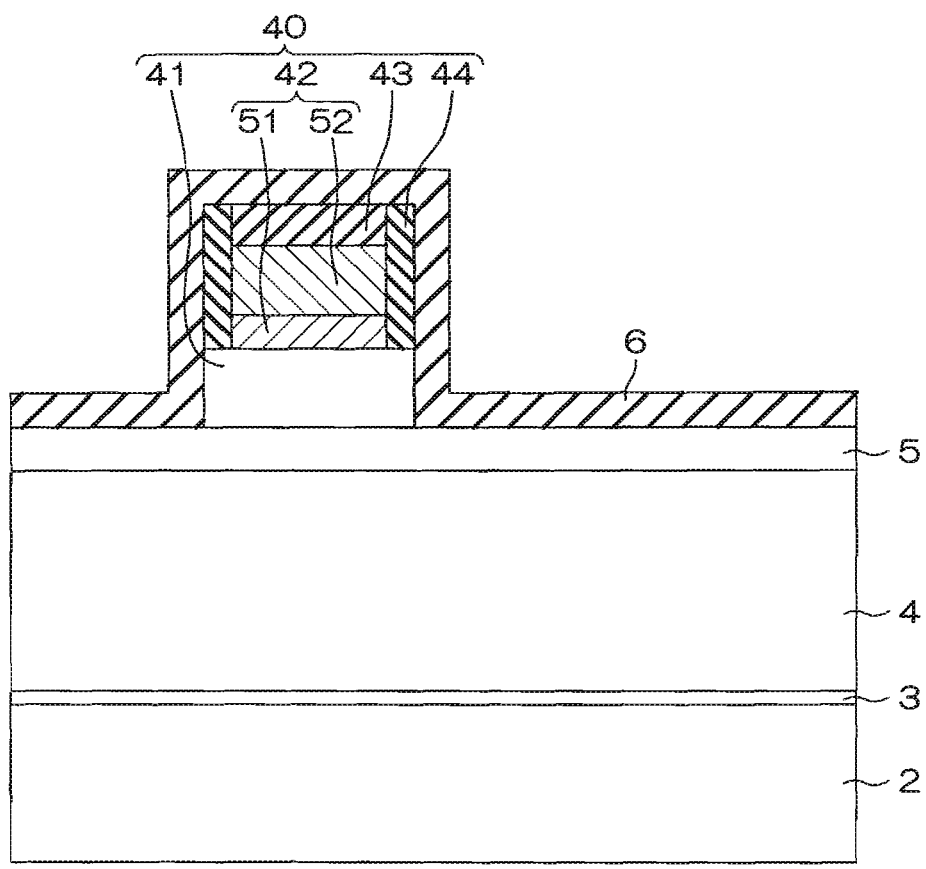

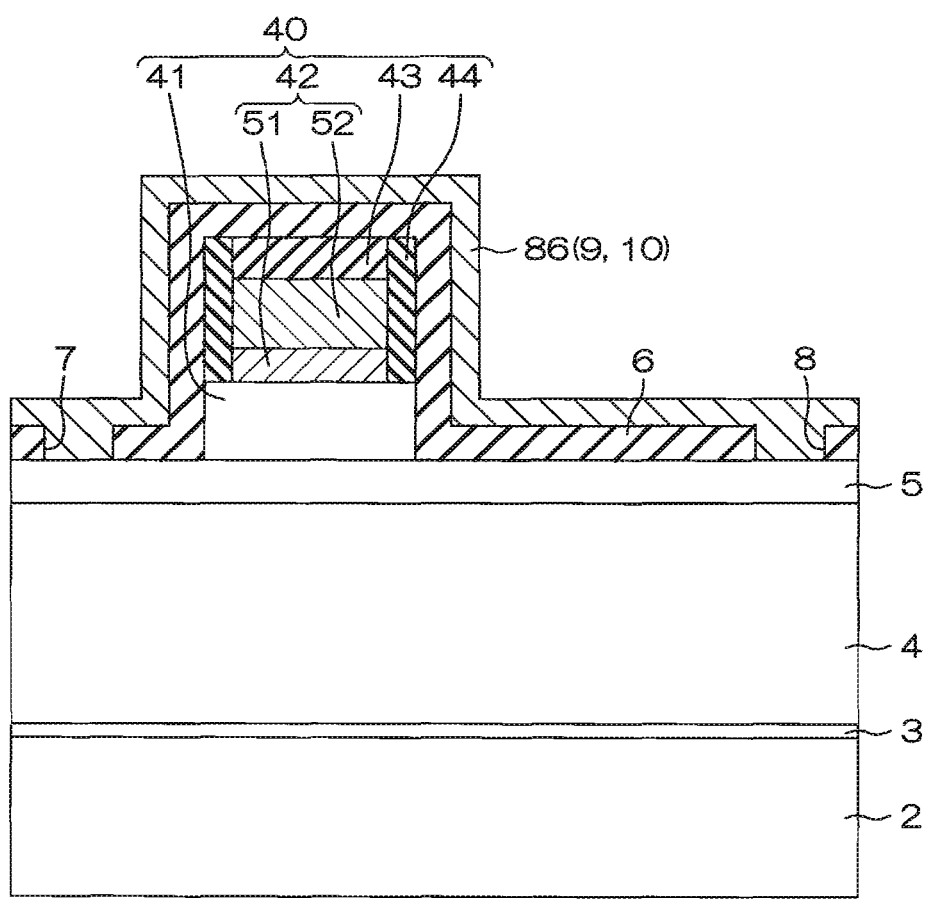

NITRIDE SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2018-225694, filed on Nov. 30, 2018, the entire contents of which are incorporated herein by reference.

TECHNICAL FIELD

The present disclosure relates to a nitride semiconductor device made of a group III nitride semiconductor (hereinafter sometimes simply referred to as a "nitride semiconductor") and a method of manufacturing the same.

BACKGROUND

A group III nitride semiconductor is a semiconductor that uses nitrogen as a group V element in group III-V semiconductors. Typical examples of the group III nitride semiconductor include aluminum nitride (AlN), gallium nitride (GaN) and indium nitride (InN). In general, the group III nitride semiconductor can be expressed as $Al_xIn_yGa_{1-x-y}N$ ($0 \le x \le 1$, $0 \le y \le 1$, $0 \le x+y \le 1$). There has been proposed a HEMT (High Electron Mobility Transistor) that uses such a nitride semiconductor. Such HEMT includes an electron transit layer made of, for example, GaN, and an electron supply layer made of, for example, AlGaN, which is epitaxially grown on the electron transit layer. A pair of source electrode and drain electrode is formed so as to be in contact with the electron supply layer, and a gate electrode is interposed between the pair of source electrode and drain electrode.

Due to polarization caused by a lattice mismatch between GaN and AlGaN, a two-dimensional electron gas is formed in the electron transit layer at a position several Å inward from the interface between the electron transit layer and the electron supply layer. The source and the drain of the HEMT are interconnected by this two-dimensional electron gas as a channel. When the two-dimensional electron gas is cut off by applying a control voltage to the gate electrode of the HEMT, the source and the drain are disconnected from each other. In a state where no control voltage is applied to the gate electrode, the source and drain are electrically interconnected, thereby becoming a normally-on type device.

Since a device using the nitride semiconductor has characteristics such as a high breakdown voltage, high temperature operation, large current density, high speed switching, and low on-resistance, an application of the device to a power device has been studied. However, in order to use the HEMT for the power device, the power device needs to be a normally-off type device that cuts off a current at a zero bias. Therefore, the HEMT as described above cannot be applied to the power device.

A structure has been proposed for realizing a normally-off type nitride semiconductor HEMT.

In the related art, a structure is disclosed in which a p-type GaN gate layer (nitride semiconductor gate layer) is stacked on an AlGaN electron supply layer, a gate electrode is disposed thereon, and a channel is eliminated by a depletion layer spreading from the p-type GaN gate layer, thereby achieving normally-off. In the structure disclosed in the related art, the gate electrode is made of TiN (titanium nitride) that forms a Schottky junction with the p-type GaN gate layer. In such a structure, although the p-type nitride semiconductor gate layer and the TiN gate electrode form the Schottky junction, the energy barrier (barrier height) between the gate electrode and the nitride semiconductor gate layer is insufficient, which may cause a problem of a large gate leakage current.

If the gate leakage current is large, a gate voltage required to obtain the desired on-resistance cannot be secured or power consumption in a gate drive circuit increases, which may result in a decrease in efficiency and an increase in generated heat in a power circuit and a control circuit part. This is a major problem for HEMTs that feature high frequency switching.

SUMMARY

Some embodiments of the present disclosure provide a nitride semiconductor device capable of reducing a gate leakage current.

According to one embodiment of the present disclosure, there is provided a nitride semiconductor device that includes a first nitride semiconductor layer configured as an electron transit layer; a second nitride semiconductor layer formed on the first nitride semiconductor layer and configured as an electron supply layer; a ridge-shaped nitride semiconductor gate layer disposed on the second nitride semiconductor layer and including an acceptor-type impurity; and a gate electrode formed on the nitride semiconductor gate layer, wherein the gate electrode includes a first metal film that is formed on the nitride semiconductor gate layer and is mainly made of Ti, and a second metal film that is formed on the first metal film and is made of TiN.

With this configuration, the gate electrode includes the first metal film that is formed on the nitride semiconductor gate layer and is mainly made of Ti, and the second metal film that is formed on the first metal film and is made of TiN. Here, as the material property, the barrier height with respect to the p-type semiconductor layer containing the acceptor-type impurity is higher in TiN than in Ti. However, when Ti reacts with nitrogen N on the surface of the nitride semiconductor, there is an effect that the nitride semiconductor layer surface is made n-type by N vacancies. As a result, since the barrier height can be increased with respect to carriers caused by the gate leakage current, as compared with a case where the gate electrode includes only a TiN metal film, the gate leakage current can be decreased.

According to another embodiment of the present disclosure, there is provided a nitride semiconductor device that includes a first nitride semiconductor layer configured as an electron transit layer; a second nitride semiconductor layer formed on the first nitride semiconductor layer and configured as an electron supply layer; a ridge-shaped nitride semiconductor gate layer disposed on the second nitride semiconductor layer; and a gate electrode formed on the nitride semiconductor gate layer, wherein the gate electrode includes a first metal film that is formed on the nitride semiconductor gate layer and is made of TiN, and a second metal film that is stacked on the first metal film and is made of TiN, and wherein a Ti/N composition ratio of the first metal film is larger than a Ti/N composition ratio of the second metal film.

With this configuration, the gate electrode includes the first metal film that is formed on the nitride semiconductor gate layer and is made of TiN, and the second metal film that is stacked on the first metal film and is made of TiN, and the Ti/N composition ratio of the first metal film is larger than the Ti/N composition ratio of the second metal film. Accordingly, since the barrier height between the gate electrode and the nitride semiconductor gate layer can be increased as compared with a case where the gate electrode is composed of only a TiN metal film having the Ti/N composition ratio of the second metal film, the gate leakage current can be decreased.

According to some embodiments of the present disclosure, the nitride semiconductor gate layer comprises only a third nitride semiconductor layer containing an acceptor-type impurity, and the nitride semiconductor gate layer includes a third nitride semiconductor layer that is formed on the second nitride semiconductor layer and contains an acceptor-type impurity, and a fourth nitride semiconductor layer that is stacked on the third nitride semiconductor layer and has a hole concentration lower than a hole concentration of the third nitride semiconductor layer.

According to some embodiments of the present disclosure, the fourth nitride semiconductor layer contains a donor-type impurity, and a pair of first dielectric films formed on both sides of an upper surface of the nitride semiconductor gate layer, wherein the first metal film is formed so as to cover a portion between the pair of first dielectric films on the upper surface of the nitride semiconductor gate layer, and an upper surface and side surfaces of the pair of first dielectric films, which face each other.

According to some embodiments of the present disclosure, the nitride semiconductor device further includes a pair of first dielectric films formed on both sides of an upper surface of the nitride semiconductor gate layer, wherein the first metal film is interposed between the pair of first dielectric films, and wherein a lower surface of the first metal film is in contact with a portion of the upper surface between the pair of first dielectric films on the nitride semiconductor gate layer, and a side surface of the first metal film is covered with the pair of first dielectric films.

According to some embodiments of the present disclosure, the nitride semiconductor device further includes a second dielectric film that covers at least a side surface of the nitride semiconductor gate layer and a side surface of the first dielectric film, wherein the first dielectric film is SiN, SiO2, SiON or a composite layer thereof, and wherein the first dielectric film is SiN, SiO2, SiON or a composite layer thereof, and the second dielectric film is SiN, SiO2, SiON or a composite film thereof.

According to another embodiment of the present disclosure, there is provided a method of manufacturing a nitride semiconductor device, which includes: forming a first nitride semiconductor layer constituting an electron transit layer, a second nitride semiconductor layer constituting an electron supply layer, a nitride semiconductor gate layer material film containing an acceptor-type impurity, and a first dielectric film in sequence on a substrate; forming a gate opening reaching the nitride semiconductor gate layer material film in the first dielectric film; forming a gate electrode film on the nitride semiconductor gate layer material film so as to cover at least the gate opening and both peripheral edges of the gate opening on the surface of the first dielectric film; forming a gate portion including a ridge-shaped nitride semiconductor gate layer, a pair of first dielectric films disposed on both sides of the upper surface of the nitride semiconductor gate layer, and a gate electrode formed on the surfaces of the nitride semiconductor gate layer and the first dielectric films by selectively removing the nitride semiconductor gate layer material film, the first dielectric films and the gate electrode film so that the gate opening and the peripheral regions on both sides of the gate opening remain in plan view; forming a second dielectric film that covers the second nitride semiconductor layer and an exposed surface of the gate portion; forming a source electrode and a drain electrode that reach the second nitride semiconductor layer through the second dielectric film; and performing an annealing process between the forming the gate portion and the forming the source electrode and the drain electrode or after the forming the source electrode and the drain electrode, wherein the gate electrode film is composed of a first metal film that is formed on the nitride semiconductor gate layer and is made of Ti, and a second metal film that is stacked on the first metal film and is made of TiN, and wherein a region made of TiN is formed in a surface layer portion of the first metal film toward the nitride semiconductor gate layer by reaction with N in the nitride semiconductor gate layer by the annealing process.

According to this method of manufacturing a nitride semiconductor device, it is possible to achieve a nitride semiconductor device capable of reducing a gate leakage current.

According to another embodiment of the present disclosure, there is provided a method of manufacturing a nitride semiconductor device, which includes: forming a first nitride semiconductor layer constituting an electron transit layer, a second nitride semiconductor layer constituting an electron supply layer, a nitride semiconductor gate layer material film containing an acceptor-type impurity, a gate electrode film, and a third dielectric film in sequence on a substrate; removing the third dielectric film, while leaving a gate electrode formation region on the gate electrode film; forming a gate electrode by etching the gate electrode film using the third dielectric film as a mask; forming a first dielectric film that covers a side surface of the gate electrode; forming a nitride semiconductor gate layer by etching the nitride semiconductor gate layer material film using the third dielectric film and the first dielectric film as a mask; forming a second dielectric film that covers exposed surfaces of the second nitride semiconductor layer, the nitride semiconductor gate layer, the gate electrode, the first dielectric film, and the third dielectric film; forming a source electrode and a drain electrode that reach the second nitride semiconductor layer through the second dielectric film; and performing an annealing process between the forming the second dielectric film and the forming the source electrode and the drain electrode or after the forming the source electrode and the drain electrode, wherein the gate electrode film includes a first metal film that is formed on the nitride semiconductor gate layer and is made of Ti, and a second metal film that is stacked on the first metal film and is made of TiN, and wherein a region made of TiN is formed in a surface layer portion of the first metal film toward the nitride semiconductor gate layer by reaction with N in the nitride semiconductor gate layer by the annealing process.

According to this method of manufacturing a nitride semiconductor device, it is possible to achieve a nitride semiconductor device capable of reducing a gate leakage current.

BRIEF DESCRIPTION OF DRAWINGS

FIG. 3F is a cross-sectional view showing a step subsequent to the step of FIG. 3E.

FIG. 3G is a cross-sectional view showing a step subsequent to the step of FIG. 3F.

FIG. 3I is a cross-sectional view showing a step subsequent to the step of FIG. 3H.

FIG. 4 is a graph showing experimental results of a gate-source leakage current [A/mm] with respect to a gate-source voltage [V].

FIG. 8G is a cross-sectional view showing a step subsequent to the step of FIG. 8F.

FIG. 8H is a cross-sectional view showing a step subsequent to the step of FIG. 8G.

FIG. 8J is a cross-sectional view showing a step subsequent to the step of FIG. 8I.

DETAILED DESCRIPTION

Figure 1:
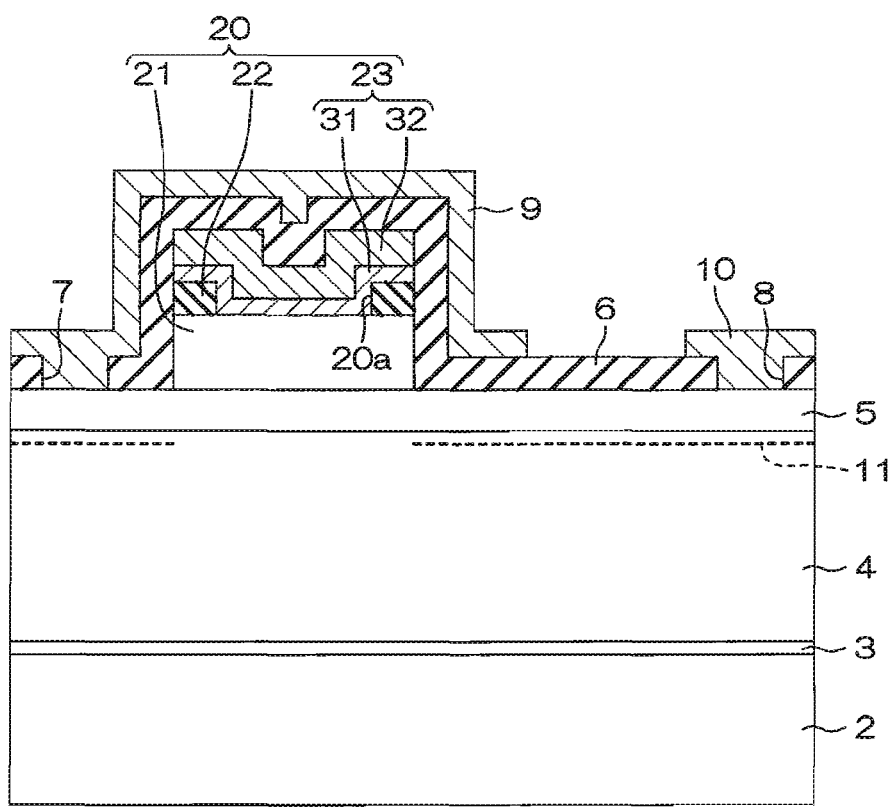
FIG. 1 is a cross-sectional view for explaining a configuration of a nitride semiconductor device according to a first embodiment of the present disclosure.
Figure 2:
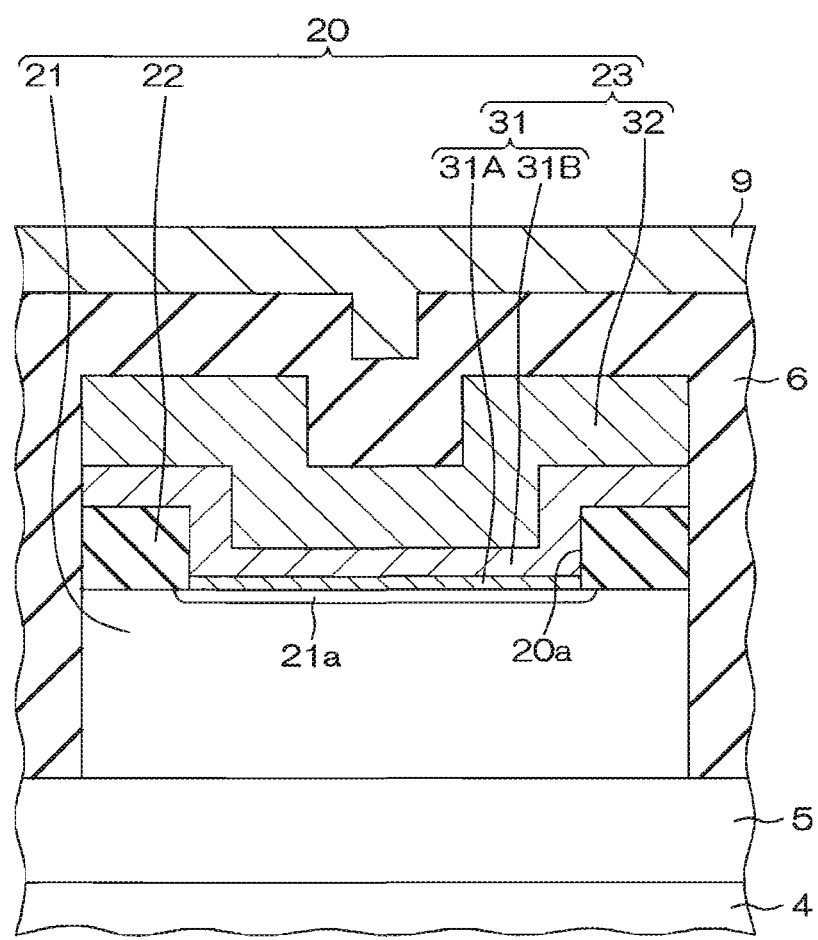
FIG. 2 is a partially-enlarged cross-sectional view for explaining the detailed configuration of a gate portion in FIG. 1.

Embodiments of the present disclosure will be described in detail with reference to the accompanying drawings. FIG. 1 is a cross-sectional view for explaining a configuration of a nitride semiconductor device according to a first embodiment of the present disclosure. FIG. 2 is a partially-enlarged cross-sectional view for explaining a detailed configuration of a gate portion in FIG. 1. The nitride semiconductor device 1 includes a substrate 2, a buffer layer 3 formed on the surface of the substrate 2, a first nitride semiconductor layer 4 epitaxially grown on the buffer layer 3, a second nitride semiconductor layer 5 epitaxially grown on the first nitride semiconductor layer 4, and a gate portion 20 formed on the second nitride semiconductor layer 5.

The nitride semiconductor device 1 further includes a passivation film 6 (second dielectric film) that covers the second nitride semiconductor layer 5 and the gate portion 20. The nitride semiconductor device 1 further includes a source electrode 9 and a drain electrode 10 that are in ohmic contact with the second nitride semiconductor layer 5 through a source contact hole 7 and a drain contact hole 8, respectively, which are formed in the passivation film 6. The source electrode 9 and the drain electrode 10 are arranged at an interval. The source electrode 9 is formed so as to cover the gate portion 20.

The substrate 2 may be, for example, a low resistance silicon substrate. The low resistance silicon substrate may be, for example, a p-type substrate having an electrical resistivity of 0.001 Ωmm to 0.5 Ωmm (more specifically, about 0.01 Ωmm to 0.1 Ωmm). Alternatively, the substrate 2 may be a low resistance SiC substrate, a low resistance GaN substrate, or the like instead of the low resistance silicon substrate. The thickness of the substrate 2 is, for example, about 650 μm in the course of the semiconductor manufacturing process, and is ground to about 300 μm or less in a step before chip formation. The substrate 2 is electrically connected to the source electrode 9.

In this embodiment, the buffer layer 3 is a multi-layered buffer layer in which a plurality of nitride semiconductor films is stacked. In this embodiment, the buffer layer 3 includes a first buffer layer (not shown) which is an AlN film in contact with the surface of the substrate 2, and a second buffer layer (not shown) which is an AlN/AlGaN superlattice layer stacked on the surface of the first buffer layer (the surface on an opposite side to the substrate 2). The film thickness of the first buffer layer is about 100 nm to 500 nm. The film thickness of the second buffer layer is about 500 nm to 2 μm. The buffer layer 3 may be, for example, a single film or a composite film of AlGaN.

The first nitride semiconductor layer 4 constitutes an electron transit layer. In this embodiment, the first nitride semiconductor layer 4 is a GaN layer and has a thickness of about 0.5 μm to 2 μm. Further, for the purpose of suppressing a leakage current from flowing through the first nitride semiconductor layer 4, an impurity for making the first nitride semiconductor layer 4 semi-insulating may be introduced into regions other than the surface region thereof. In that case, the impurity concentration may be $4\times10^{16}$ cm$^{-3}$ or more. The impurity is, for example, C or Fe.

The second nitride semiconductor layer 5 constitutes an electron supply layer. The second nitride semiconductor layer 5 is made of a nitride semiconductor having a band gap larger than that of the first nitride semiconductor layer 4. Specifically, the second nitride semiconductor layer 5 is made of a nitride semiconductor having an Al composition higher than that of the first nitride semiconductor layer 4. In nitride semiconductors, the higher the Al composition, the larger the band gap. In this embodiment, the second nitride semiconductor layer 5 is an $Al_{x1}Ga_{1-x1}N$ layer (0<x1<1) and has a thickness of about 5 nm to 15 nm.

In this manner, the first nitride semiconductor layer (electron transit layer) 4 and the second nitride semiconductor layer (electron supply layer) 5 are made of nitride semiconductors having different band gaps (Al compositions) and have a lattice mismatch therebetween. Then, due to the spontaneous polarization of the first nitride semiconductor layer 4 and the second nitride semiconductor layer 5 and the piezoelectric polarization caused by the lattice mismatch therebetween, the energy level of the conduction band of the first nitride semiconductor layer 4 at an interface between the first nitride semiconductor layer 4 and the second nitride semiconductor layer 5 becomes lower than the Fermi level. Accordingly, in the first nitride semiconductor layer 4, a two-dimensional electron gas (2DEG) is spread at a position close to the interface between the first nitride semiconductor layer 4 and the second nitride semiconductor layer 5 (for example, a distance of about several Å from the interface).

The gate portion 20 includes a ridge-shaped nitride semiconductor gate layer 21 epitaxially grown on the second nitride semiconductor layer 5, a pair of dielectric films (first dielectric film) 22 formed on both sides of the nitride semiconductor gate layer 21, and a gate electrode 23 formed on the surfaces of the nitride semiconductor gate layer 21 and the dielectric films 22. The gate portion 20 is disposed so as to be biased toward the source contact hole 7.

In this embodiment, the nitride semiconductor gate layer 21 has a substantially rectangular cross-sectional shape. The dielectric films 22 also have a substantially rectangular cross-sectional shape. Hereinafter, there is a case that a recess may be referred to as a gate opening 20a, where a bottom surface of the recess corresponds to a portion between the pair of dielectric films 22 on the upper surface of the nitride semiconductor gate layer 21 and an inner surface of the recess corresponds to the opposite side surfaces of the pair of dielectric films 22 formed on both sides of the nitride semiconductor gate layer 21.

The nitride semiconductor gate layer 21 is made of a nitride semiconductor doped with an acceptor-type impurity. In this embodiment, the nitride semiconductor gate layer 21 is a GaN layer doped with an acceptor-type impurity (p-type GaN layer), and has a thickness of about 40 nm to 100 nm. The concentration of acceptor-type impurity implanted into the nitride semiconductor gate layer 21 may be $1 \times 10^{19}$ cm$^{-3}$ or more. In this embodiment, the acceptor-type impurity is Mg (magnesium). The acceptor-type impurity may be an acceptor-type impurity other than Mg, such as Zn (zinc). The nitride semiconductor gate layer 21 is provided to cancel out a two-dimensional electron gas 11 generated near the interface between the first nitride semiconductor layer 4 (electron transit layer) and the second nitride semiconductor layer 5 (electron supply layer) in a region immediately below the gate portion 20.

In this embodiment, the dielectric films 22 are made of SiN. The dielectric films 22 may be made of SiN, $SiO_2$, SiON, or a composite layer thereof. The gate electrode 23 is formed so as to cover the upper surface of the pair of dielectric films 22 and the inner surface (side surface and bottom surface) of the gate opening 20a. The gate electrode 23 includes a first metal film 31, which is a lower layer mainly made of Ti, and a second metal film 32, which is an upper layer made of TiN and stacked on the first metal film 31. The film thickness of the first metal film 31 is about 5 nm to 10 nm, and the film thickness of the second metal film 32 is about 50 nm to 150 nm.

The first metal film 31 is in contact with a portion between the pair of dielectric films 22 on the upper surface of the nitride semiconductor gate layer 21, and also in contact with the upper surface and the side surfaces (inner side surfaces), which face each other, of the pair of dielectric films 22. In the first metal film 31, both side surfaces of a surface layer portion that is in surface contact with the nitride semiconductor gate layer 21 are covered with the inner side surfaces of the pair of dielectric films 22. As shown in FIG. 2, the first metal film 31 has a first region 31A made of TiN which is a surface layer portion that is in surface contact with the nitride semiconductor gate layer 21, and a second region 31B made of Ti other than the first region 31A. The first region 31A is originally made of Ti like the second region 31B, but is a region where TiN is formed by reacting with N in the surface layer portion of the nitride semiconductor gate layer 21 in the manufacturing process. A Ti/N composition ratio of the first region 31A is larger than a Ti/N composition ratio of the second metal film 32. For example, the Ti/N composition ratio of the second metal film 32 is about 1, whereas the Ti/N composition ratio of the first region 31A is about 2.

In the manufacturing process, N is desorbed from the surface layer portion of the nitride semiconductor gate layer 21 due to the formation of TiN by the reaction of N in the surface layer portion of the nitride semiconductor gate layer 21 and Ti in the first metal film 31. Thus, the surface layer portion of the nitride semiconductor gate layer 21 becomes n-type. As a result, as shown in FIG. 2, in the nitride semiconductor gate layer 21, a p-type or n-type GaN region 21a having a hole concentration lower than that of the nitride semiconductor gate layer 21 is formed in the surface layer portion that is in surface contact with the first metal film 31.

Referring back to FIG. 1, the passivation film 6 covers the surface of the second nitride semiconductor layer 5 (excluding regions corresponding to the contact holes 7 and 8), and sides and a surface of the gate portion 20. In this embodiment, the passivation film 6 is a SiN film and has a thickness of about 50 nm to 200 nm. The passivation film 6 may be made of SiN, $SiO_2$, SiON, or a composite film thereof.

The source electrode 9 and the drain electrode 10 include, for example, a first metal layer (ohmic metal layer) in contact with the second nitride semiconductor layer 5, a second metal layer (main electrode metal layer) stacked on the first metal layer, a third metal layer (adhesion layer) stacked on the second metal layer, and a fourth metal layer (barrier metal layer) stacked on the third metal layer. The first metal layer is, for example, a Ti layer having a thickness of about 10 nm to 20 nm. The second metal layer is, for example, an Al layer having a thickness of about 100 nm to 300 nm. The third metal layer is, for example, a Ti layer having a thickness of about 10 nm to 20 nm. The fourth metal layer is, for example, a TiN layer having a thickness of about 10 nm to 50 nm.

In this nitride semiconductor device 1, the second nitride semiconductor layer 5 (electron supply layer) having the band gap (Al composition) different from that of the first nitride semiconductor layer 4 (electron transit layer) is formed on the first nitride semiconductor layer 4 to form a heterojunction. As a result, a two-dimensional electron gas 11 is formed in the first nitride semiconductor layer 4 near the interface between the first nitride semiconductor layer 4 and the second nitride semiconductor layer 5, and an HEMT is formed using the two-dimensional electron gas 11 as a channel. The gate electrode 23 faces the second nitride semiconductor layer 5 with the nitride semiconductor gate layer 21 interposed therebetween.

Below the gate electrode 23, the energy levels of the first nitride semiconductor layer 4 and the second nitride semiconductor layer 5 are raised by ionized acceptors included in the nitride semiconductor gate layer 21, which is the p-type GaN layer. Accordingly, the energy level of the conduction band at the heterojunction interface between the first nitride semiconductor layer 4 and the second nitride semiconductor layer 5 becomes higher than the Fermi level. Therefore, a two-dimensional electron gas 11, which is caused by the spontaneous polarization of the first nitride semiconductor layer 4 and the second nitride semiconductor layer 5 and the piezo polarization caused by a lattice mismatch therebetween, is not formed immediately below the gate electrode 23 (the gate portion 20).

Therefore, when bias is not applied to the gate electrode 23 (at the time of zero bias), the channel by the two-dimensional electron gas 11 is cut off immediately below the gate electrode 23. Thus, a normally-off type HEMT is realized. When an appropriate on voltage (for example, 3V) is applied to the gate electrode 23, a channel is induced in the first nitride semiconductor layer 4 immediately below the gate electrode 23 to interconnect the two-dimensional electron gases 11 on both sides of the gate electrode 23. As a result, the source and drain of the HEMT are electrically interconnected.

When in use, for example, a predetermined voltage (e.g., 10V to 500V), which is positive on the drain electrode 10 side, is applied between the source electrode 9 and the drain electrode 10. In this state, an off voltage (0V) or an on voltage (5V) is applied to the gate electrode 23 with the source electrode 9 as a reference potential (0V). FIGS. 3A to 3I are cross-sectional views for explaining an example of a process of manufacturing the above-described nitride semiconductor device 1, and depict cross-sectional structures at a plurality of steps in the manufacturing process.

Figure 3A:
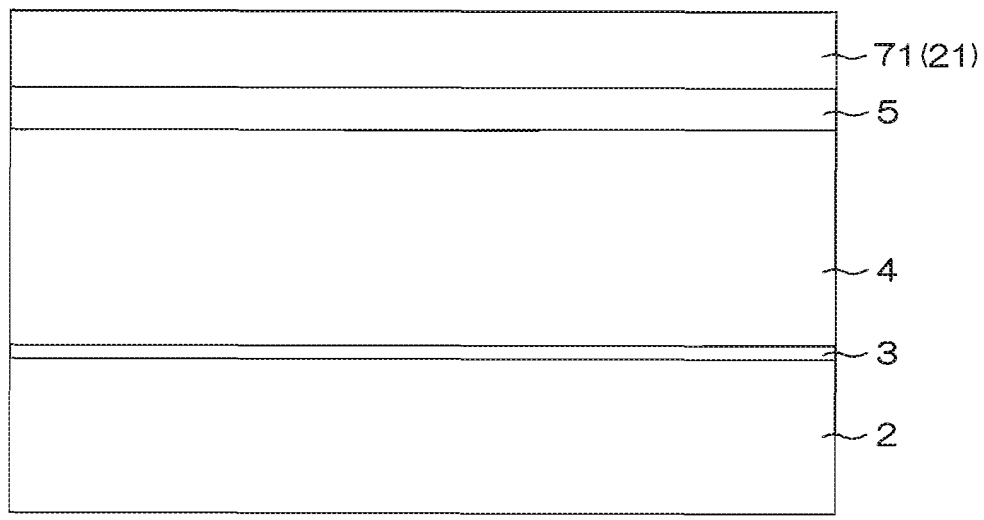
FIG. 3A is a cross-sectional view showing a step in a process of manufacturing the nitride semiconductor device in FIG. 1.

First, as shown in FIG. 3A, the buffer layer 3, the first nitride semiconductor layer (electron transit layer) 4, and the second nitride semiconductor layer (electron supply layer) 5 are epitaxially grown on the substrate 2 by MOCVD (Metal Organic Chemical Vapor Deposition). Further, a gate layer material film 71, which is a material film of the nitride semiconductor gate layer 21, is formed on the second nitride semiconductor layer 5 by MOCVD.

Figure 3B:
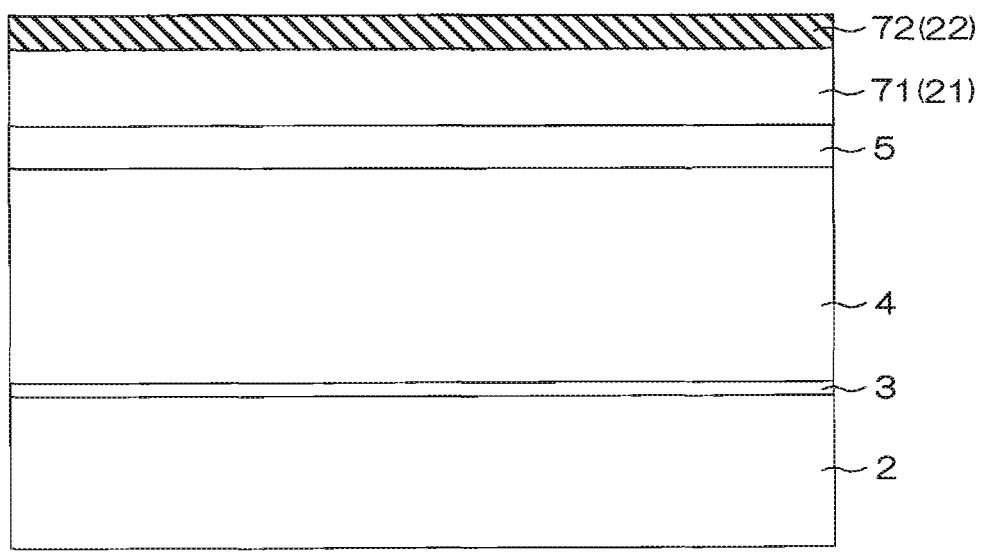
FIG. 3B is a cross-sectional view showing a step subsequent to the step of FIG. 3A.
Figure 3C:
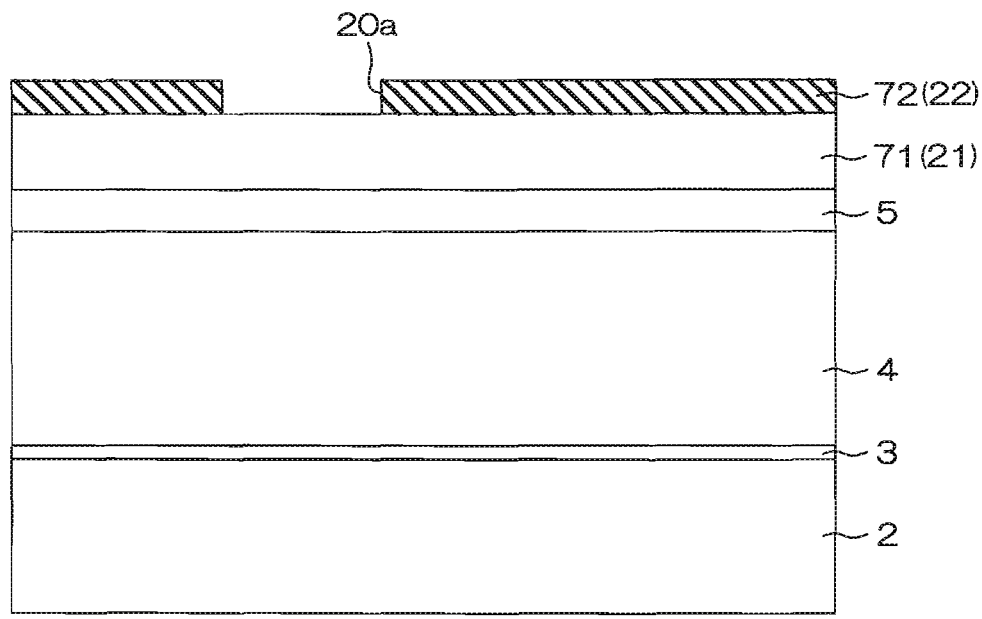
FIG. 3C is a cross-sectional view showing a step subsequent to the step of FIG. 3B.

Next, as shown in FIG. 3B, a SiN film 72, which is a material film of the dielectric films 22, is formed on the gate layer material film 71 by, for example, LPCVD (Low Pressure Chemical Vapor Deposition). Next, as shown in FIG. 3C, the gate opening 20a reaching the gate layer material film 71 is formed in the SiN film 72 by photolithography and etching.

Figure 3D:
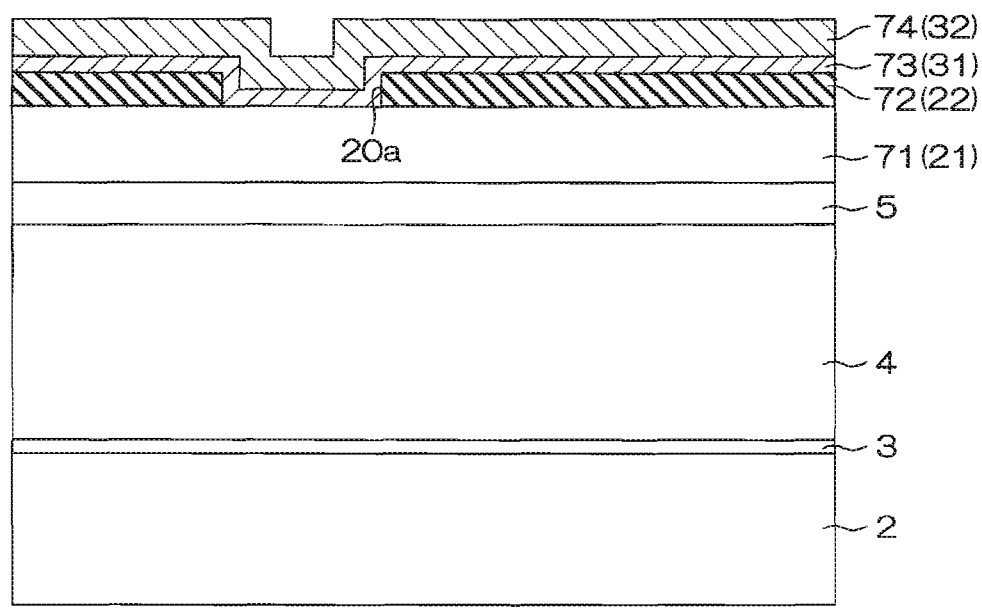
FIG. 3D is a cross-sectional view showing a step subsequent to the step of FIG. 3C.
Figure 3E:
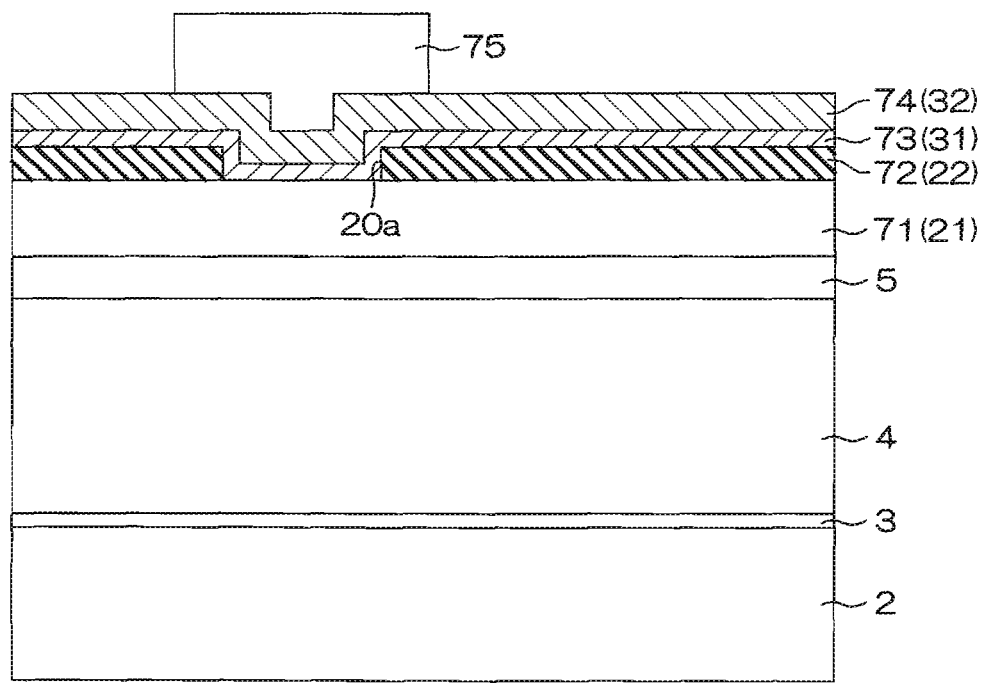
FIG. 3E is a cross-sectional view showing a step subsequent to the step of FIG. 3D.

Next, as shown in FIG. 3D, a Ti film 73, which is a material film of the first metal film 31, is formed by sputtering so as to cover the entire exposed surface, and then, a TiN film 74, which is a material film of the second metal film 32, is formed on the Ti film 73. Next, as shown in FIG. 3E, a resist pattern 75 is formed on the TiN film 74 by photolithography so as to cover a portion of the TiN film 74 which becomes the second metal film 32 (the gate electrode 23).

Thereafter, as shown in FIG. 3F, the TiN film 74, the Ti film 73, the SiN film 72, and the gate layer material film 71 are patterned by etching using the resist pattern 75 as a mask. As a result, the gate portion 20 composed of the nitride semiconductor gate layer 21, the dielectric films 22, and the gate electrode 23 is formed. The gate electrode 23 includes the first metal film 31, which is the lower layer, and the second metal film 32, which is the upper layer. At this step, the first metal film 31 is made of Ti. After the gate portion 20 is formed, the resist pattern 75 is removed.

Next, as shown in FIG. 3G, a passivation film 6 is formed so as to cover the entire exposed surface. The passivation film 6 is made of, for example, SiN. Thereafter, an annealing process is performed in a nitrogen atmosphere. Through this annealing step, N in the surface layer portion of the nitride semiconductor gate layer 21 reacts with Ti in the first metal film 31 to form the first region 31A (see FIG. 2) made of TiN in the surface layer portion of the first metal film 31 toward the nitride semiconductor gate layer 21. Therefore, as shown in FIG. 2, the first metal film 31 has the first region 31A made of TiN and the second region 31B made of TiN, which is other than the first region 31A. In addition, through this annealing step, TiN is also formed on the sidewall of the first metal film 31. This change leads to protection of the gate electrode by a film that can withstand a wider variety of chemical cleaning and also can provide an effect of reducing gate leakage current and current collapse by an appropriate cleaning of the nitride semiconductor surface.

On the other hand, N is desorbed from the surface layer portion of the nitride semiconductor gate layer 21 due to the formation of TiN by the reaction of N in the surface layer portion of the nitride semiconductor gate layer 21 and Ti of the first metal film 31. In so doing, the surface layer portion of the nitride semiconductor gate layer 21 becomes n-type, and a p-type or n-type GaN region 21a (see FIG. 2) having a hole concentration lower than that of the nitride semiconductor gate layer 21 is formed in the surface layer portion of the nitride semiconductor gate layer 21 toward the first metal film 31. As a result, since the barrier height between the first metal film 31 and the nitride semiconductor gate layer 21 increases with respect to carriers caused by a gate leakage current, the gate leakage current decreases.

Figure 3H:
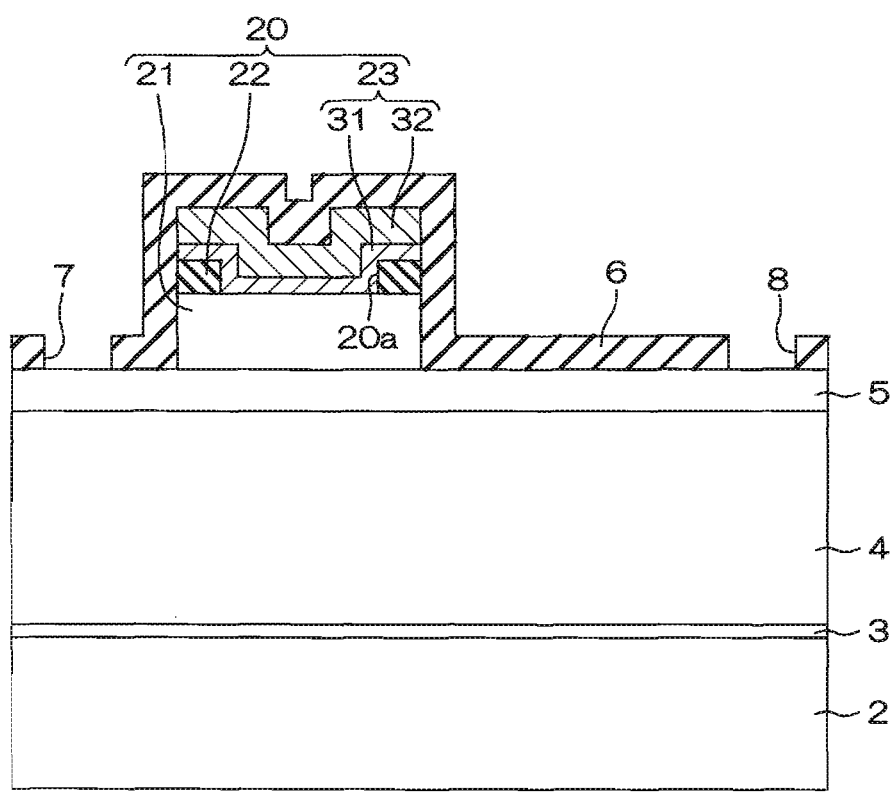
FIG. 3H is a cross-sectional view showing a step subsequent to the step of FIG. 3G.

Next, as shown in FIG. 3H, a source contact hole 7 and a drain contact hole 8 reaching the second nitride semiconductor layer 5 are formed in the passivation film 6. Next, as shown in FIG. 3I, a source/drain electrode film 76 is formed so as to cover the entire exposed surface. Finally, the source/drain electrode film 76 is patterned by photolithography and etching, so as to form a source electrode 14 and a drain electrode 15 that are in ohmic contact with the second nitride semiconductor layer 5. Thus, a nitride semiconductor device 1 having a structure shown in FIG. 1 is obtained.

In the above-described manufacturing method, the annealing process for making the surface layer portion of the nitride semiconductor gate layer 21 n-type is performed immediately after the passivation film 6 is formed. However, such an annealing process may be performed at any timing after the passivation film 6 is formed. A configuration in which the gate electrode 23 in the above-described embodiment is replaced with a gate electrode made of TiN is referred to as a comparative example.

FIG. 4 is a graph showing experimental results of a gate-source leakage current [A/mm] with respect to a gate-source voltage [V]. In the graph of FIG. 4, a solid line indicates an experimental result for the embodiment, and a broken line indicates an experimental result for the comparative example. In FIG. 4, it can be seen that the gate-source leakage current is reduced in the embodiment in comparison to that in the comparative example in a range where the gate-source voltage is about 3[V] or higher and in a range where the gate-source voltage is about −2[V] or lower.

In the above-described first embodiment, the gate electrode 23 is composed of the first metal film 31 formed on the nitride semiconductor gate layer 21 and mainly made of Ti, and the second metal film 32 stacked on the first metal film 31 and made of TiN. Accordingly, as compared with a case where the gate electrode 23 is composed of only a TiN metal film, since the barrier height between the gate electrode 23 and the nitride semiconductor gate layer 21 is increased with respect to carriers caused by a gate leakage current, the gate leakage current can be reduced.

In addition, in the above-described first embodiment, since the dielectric films 22 are formed on both sides of the upper surface of the nitride semiconductor gate layer 21, the gate electrode 23 is not in contact with both sides of the upper surface of the nitride semiconductor gate layer 21. Accordingly, in the above-described first embodiment, as compared with a case where the gate electrode is in contact with both sides of the upper surface of the nitride semiconductor gate layer 21, a path in which a leakage current flows from the gate electrode 23 to the source electrode 9 through the surface of the nitride semiconductor gate layer 21 can be lengthened. As a result, the gate leakage current can be reduced.

Ti constituting the first metal film 31 has a property of being easily oxidized. In the above-described first embodiment, both side surfaces of the surface layer portion of the first metal film 31 that is in surface contact with the nitride semiconductor gate layer 21 are covered with the inner side surfaces of the pair of dielectric films 22. Accordingly, in the manufacturing process, both side surfaces of the surface layer portion of the first metal film 31 are not exposed to the atmosphere. As a result, since both side surfaces of the surface layer portion of the first metal film 31 can be prevented from being deteriorated due to oxidation, it is possible to reduce the gate leakage current.

In the above-described first embodiment, the first metal film 31 is mainly made of Ti. However, the first metal film 31 may be made of TiN. When the first metal film 31 is made of TiN, the Ti/N composition ratio of the first metal film 31 may be larger than the Ti/N composition ratio of the second metal film 32. For example, the Ti/N composition ratio of the second metal film 32 is about 1, whereas the Ti/N composition ratio of the first metal film 31 is about 2.

Since the Ti/N composition ratio of the first metal film 31 is larger than the Ti/N composition ratio of the second metal film 32, N in the surface layer portion of the nitride semiconductor gate layer 21 toward the first metal film 31 is drawn to the first metal film 31 in the manufacturing process. Accordingly, an n-type GaN layer is easily formed on the surface layer portion of the nitride semiconductor gate layer 21 toward the first metal film 31. Therefore, the gate leakage current can be reduced as compared with a case where the entire gate electrode is made of TiN having the Ti/N composition ratio of the second metal film 32.

Figure 5:
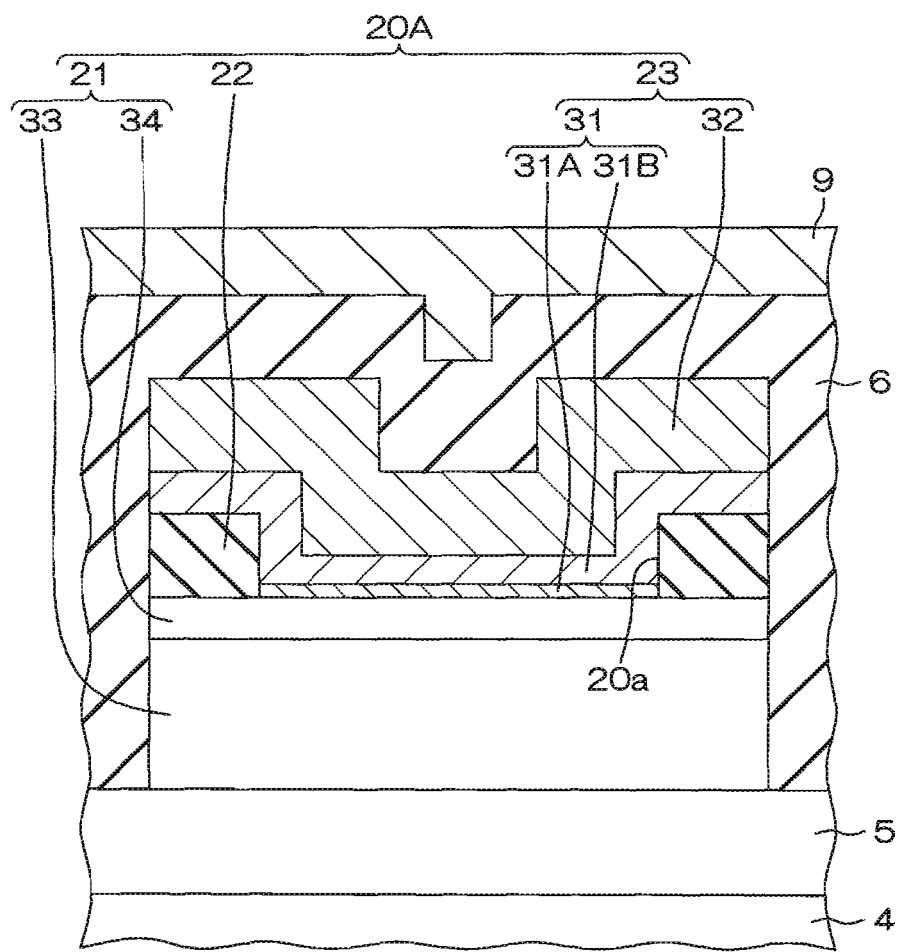
FIG. 5 is a cross-sectional view showing a modification of the gate portion in FIG. 1 that corresponds to FIG. 2.

FIG. 5 is a cross-sectional view showing a modification of the gate portion in FIG. 1 that corresponds to FIG. 2. A gate portion 20A of FIG. 5 is different from the gate portion 20 of FIG. 1 in that the nitride semiconductor gate layer 21 is composed of a third nitride semiconductor layer 33 formed on the second nitride semiconductor layer 5, and a fourth nitride semiconductor layer 34 formed on the third nitride semiconductor layer. The third nitride semiconductor layer 33 is made of a nitride semiconductor doped with an acceptor-type impurity. In this embodiment, the third nitride semiconductor layer 33 is a GaN layer doped with an acceptor-type impurity (p-type GaN layer) and has a thickness of about 50 nm to 100 nm. The concentration of the acceptor-type impurity implanted into the third nitride semiconductor layer 33 may be $1\times10^{19}$ cm$^{-3}$ or more and may be reduced up to about $1\times10^{18}$ cm$^{-3}$ near the surface. In this embodiment, the acceptor-type impurity is Mg (magnesium). The acceptor-type impurity may be an acceptor-type impurity other than Mg, such as Zn. The third nitride semiconductor layer 33 is provided to cancel out the two-dimensional electron gas 11 generated in the vicinity of the interface between the first nitride semiconductor layer 4 (electron transit layer) and the second nitride semiconductor layer 5 (electron supply layer) at a region immediately below the gate portion 20A.

The fourth nitride semiconductor layer 34 is made of a nitride semiconductor doped with a donor-type impurity. In this embodiment, the fourth nitride semiconductor layer 34 is a GaN layer doped with a donor-type impurity (n-type GaN layer) and has a thickness of 1/10 or less of the thickness of the third nitride semiconductor layer 33. The concentration of the donor-type impurity implanted into the fourth nitride semiconductor layer 34 may be, for example, $2\times10^{18}$ cm$^{-3}$ or more. In this embodiment, the acceptor-type impurity is Si (silicon). The fourth nitride semiconductor layer 34 is provided to increase the barrier height between the nitride semiconductor gate layer 21 and the gate electrode 23 to reduce the gate leakage current. As a result, even in this modified embodiment, the gate leakage current can be reduced.

Even in the gate portion 20A of FIG. 5, in the manufacturing process, N in the surface layer portion of the fourth nitride semiconductor layer 34 and Ti in the first metal film 31 react with each other to form TiN in the surface layer portion of the first metal film 31 which faces the fourth nitride semiconductor layer 34. Accordingly, the first metal film 31 has a first region 31A made of TiN and a second region 31B made of Ti other than the first region 31A in the surface layer portion toward the nitride semiconductor gate layer 21.

In the gate portion 20A of FIG. 5, the first metal film 31 is mainly made of Ti. However, the first metal film 31 may be made of TiN. When the first metal film 31 is made of TiN, the Ti/N composition ratio of the first metal film 31 may be larger than the Ti/N composition ratio of the second metal film 32. For example, the Ti/N composition ratio of the second metal film 32 is about 1, whereas the Ti/N composition ratio of the first metal film 31 is about 2.

Figure 6:
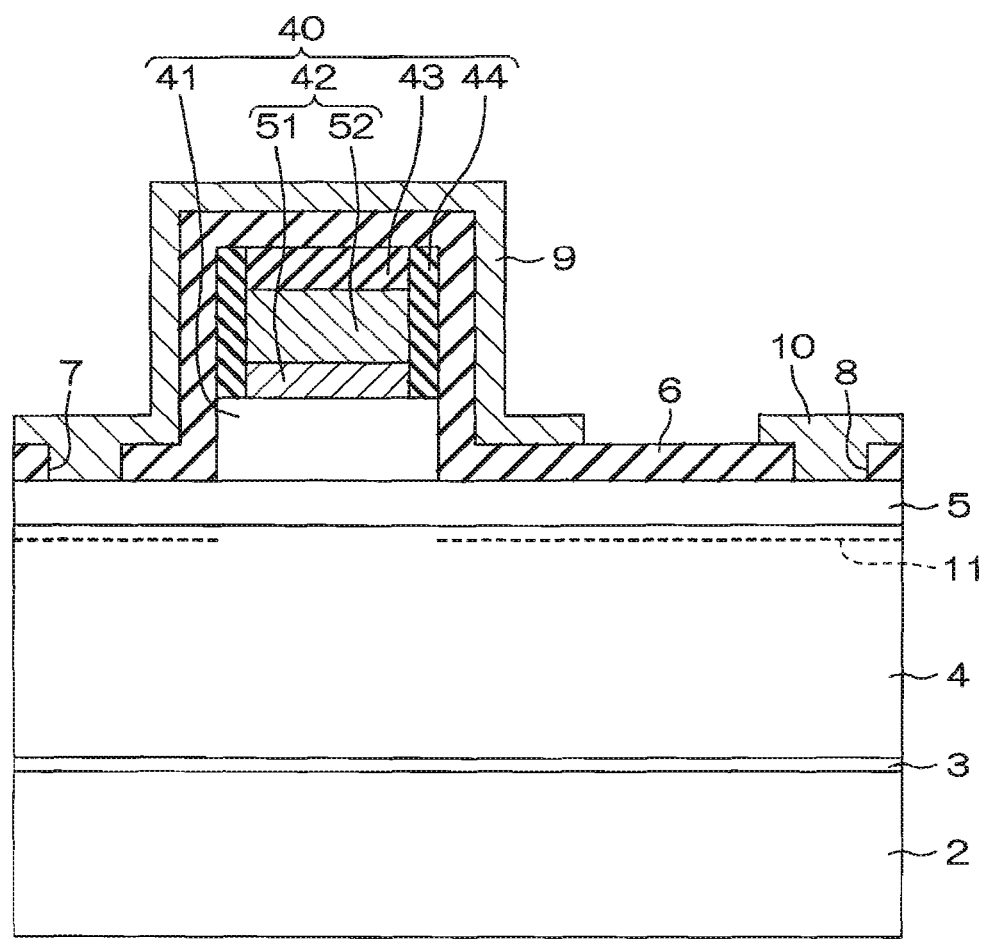
FIG. 6 is a cross-sectional view for explaining a configuration of a nitride semiconductor device according to a second embodiment of the present disclosure.
Figure 7:
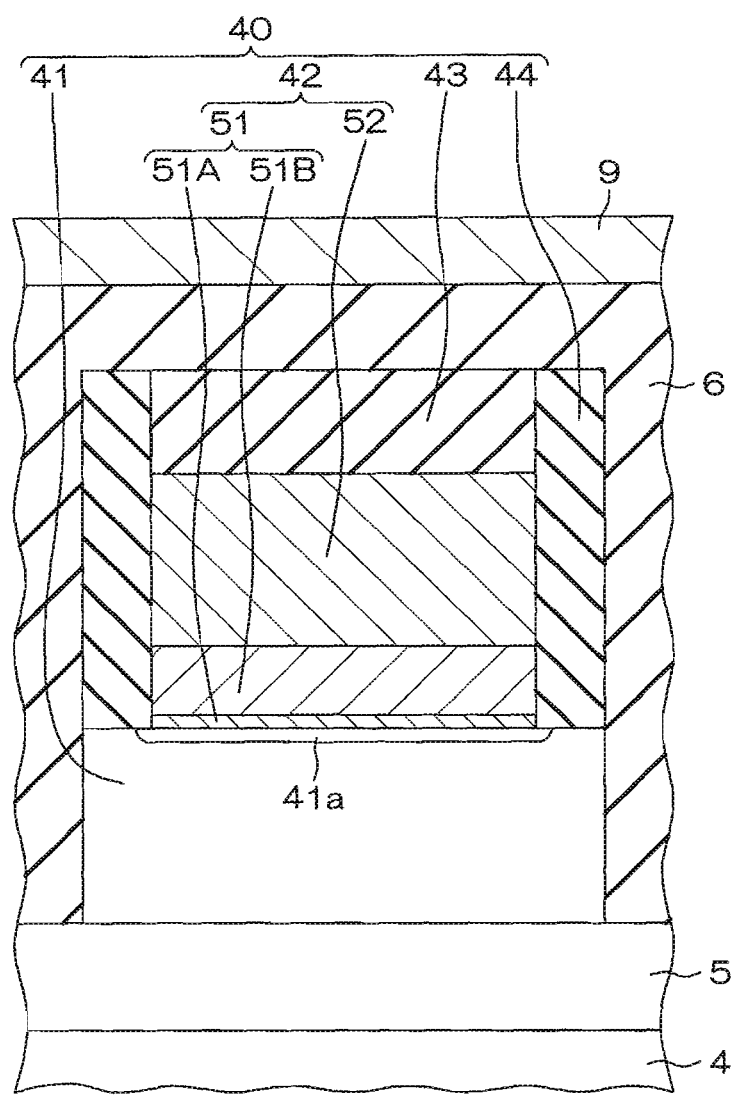
FIG. 7 is a partially-enlarged cross-sectional view for explaining the detailed configuration of a gate portion in FIG. 6.

FIG. 6 is a cross-sectional view for explaining a configuration of a nitride semiconductor device according to a second embodiment of the present disclosure. FIG. 7 is a partially-enlarged cross-sectional view for explaining a detailed configuration of a gate portion in FIG. 6. The nitride semiconductor device 101 includes a substrate 2, a buffer layer 3 formed on the surface of the substrate 2, a first nitride semiconductor layer 4 epitaxially grown on the buffer layer 3, a second nitride semiconductor layer 5 epitaxially grown on the first nitride semiconductor layer 4, and a gate portion 40 formed on the second nitride semiconductor layer 5.

The nitride semiconductor device 101 further includes a passivation film 6 (second dielectric film) that covers the second nitride semiconductor layer 5 and the gate portion 40. The nitride semiconductor device 1 further includes a source electrode 9 and a drain electrode 10 that are in ohmic contact with the second nitride semiconductor layer 5 through a source contact hole 7 and a drain contact hole 8, respectively, which are formed in the passivation film 6. The source electrode 9 and the drain electrode 10 are arranged at an interval. The source electrode 9 is formed so as to cover the gate portion 40.

The substrate 2 may be, for example, a low resistance silicon substrate. The low resistance silicon substrate may be, for example, a p-type substrate having an electrical resistivity of 0.001 Ωnm to 0.5 Ωmm (more specifically, about 0.01 Ωmm to 0.1 Ωmm). Alternatively, the substrate 2 may be a low resistance SiC substrate, a low resistance GaN substrate, or the like instead of the low resistance silicon substrate. The thickness of the substrate 2 is, for example, about 650 µm in the course of the semiconductor manufacturing process, and is ground to about 300 µm or less in a step before chip formation. The substrate 2 is electrically connected to the source electrode 9.

In this embodiment, the buffer layer 3 is a multi-layered buffer layer in which a plurality of nitride semiconductor films is stacked. In this embodiment, the buffer layer 3 includes a first buffer layer (not shown) which is an AlN film in contact with the surface of the substrate 2, and a second buffer layer (not shown) which is an AlN/AlGaN superlattice layer stacked on the surface of the first buffer layer (the surface on an opposite side to the substrate 2). The film thickness of the first buffer layer is about 100 nm to 500 nm. The film thickness of the second buffer layer is about 500 nm to 2 μm. The buffer layer 3 may be, for example, a single film or a composite film of AlGaN.

The first nitride semiconductor layer 4 constitutes an electron transit layer. In this embodiment, the first nitride semiconductor layer 4 is a GaN layer and has a thickness of about 0.5 μm to 2 μm. Further, for the purpose of suppressing a leakage current from flowing through the first nitride semiconductor layer 4, an impurity for making the first nitride semiconductor layer 4 semi-insulating may be introduced into regions other than the surface region thereof. In that case, the impurity concentration may be $4 \times 10^{16}$ cm$^{-3}$ or more. The impurity is, for example, C or Fe.

The second nitride semiconductor layer 5 constitutes an electron supply layer. The second nitride semiconductor layer 5 is made of a nitride semiconductor having a band gap larger than that of the first nitride semiconductor layer 4. Specifically, the second nitride semiconductor layer 5 is made of a nitride semiconductor having an Al composition higher than that of the first nitride semiconductor layer 4. In nitride semiconductors, the higher the Al composition, the larger the band gap. In this embodiment, the second nitride semiconductor layer 5 is an $Al_{x1}Ga_{1-x1}N$ layer (0<x1<1) and has a thickness of about 5 nm to 15 nm.

In this manner, the first nitride semiconductor layer (electron transit layer) 4 and the second nitride semiconductor layer (electron supply layer) 5 are made of nitride semiconductors having different band gaps (Al compositions) and have a lattice mismatch therebetween. Then, due to the spontaneous polarization of the first nitride semiconductor layer 4 and the second nitride semiconductor layer 5 and the piezoelectric polarization caused by the lattice mismatch therebetween, the energy level of the conduction band of the first nitride semiconductor layer 4 at the interface between the first nitride semiconductor layer 4 and the second nitride semiconductor layer 5 becomes lower than the Fermi level. Accordingly, in the first nitride semiconductor layer 4, a two-dimensional electron gas (2DEG) is spread at a position close to the interface between the first nitride semiconductor layer 4 and the second nitride semiconductor layer 5 (for example, a distance of about several Å from the interface).

The gate portion 40 includes a ridge-shaped nitride semiconductor gate layer 41 epitaxially grown on the second nitride semiconductor layer 5, a gate electrode 42 formed on a width intermediate portion of the nitride semiconductor gate layer 41 that excludes both side portions of the nitride semiconductor gate layer 41, and an insulating film 43 formed on the gate electrode 42. The gate portion 40 further includes a sidewall (first dielectric film) 44 formed on each sidewall of the stacked body of the gate electrode 42 and the insulating film 43. The gate portion 40 is disposed so as to be biased toward the source contact hole 7.

In this embodiment, the nitride semiconductor gate layer 41 has a substantially rectangular cross-sectional shape. The nitride semiconductor gate layer 41 is made of a nitride semiconductor doped with an acceptor-type impurity. In this embodiment, the nitride semiconductor gate layer 41 is a GaN layer doped with an acceptor-type impurity (p-type GaN layer), and has a thickness of about 40 nm to 100 nm.

The concentration of acceptor-type impurity implanted into the nitride semiconductor gate layer 41 may be $1 \times 10^{19}$ cm$^{-3}$ or more. In this embodiment, the acceptor-type impurity is Mg (magnesium). The acceptor-type impurity may be an acceptor-type impurity other than Mg, such as Zn (zinc). The nitride semiconductor gate layer 41 is provided to cancel out a two-dimensional electron gas 11 generated near the interface between the first nitride semiconductor layer 4 (electron transit layer) and the second nitride semiconductor layer 5 (electron supply layer) at a region immediately below the gate portion 40.

The gate electrode 42 includes a first metal film 51, which is a lower layer mainly made of Ti, and a second metal film 52, which is an upper layer made of TiN and stacked on the first metal film 51. The film thickness of the first metal film 51 is about 5 nm to 10 nm, and the film thickness of the second metal film 32 is about 50 nm to 150 nm. The lower surface of the gate electrode 42 (the first metal film 51) is in contact with a portion between two sidewalls 44 on the upper surface of the nitride semiconductor gate layer 41. Both side surfaces of the gate electrode 42 are covered with sidewalls 44, and the upper surface of the gate electrode 42 is covered with the insulating film 43.

As shown in FIG. 7, the first metal film 51 includes a first region 51A made of TiN, which is a surface layer portion facing the nitride semiconductor gate layer 41, and a second region 51B made of Ti other than the first region 51A. The first region 51A is originally made of Ti like the second region 31B, but is a region where TiN is formed by reacting with N in the surface layer portion of the nitride semiconductor gate layer 41 in the manufacturing process. The Ti/N composition ratio of the first region 51A of the first metal film 51 is larger than the Ti/N composition ratio of the second metal film 52. For example, the Ti/N composition ratio of the second metal film 52 is about 1, whereas the Ti/N composition ratio of the first region 51A of the first metal film 51 is about 2.

In the manufacturing process, N is desorbed from the surface layer portion of the nitride semiconductor gate layer 41 due to the formation of TiN by the reaction of N in the surface layer portion of the nitride semiconductor gate layer 41 and Ti in the first metal film 51. Thus, the surface layer portion of the nitride semiconductor gate layer 41 becomes n-type. In so doing, as shown in FIG. 7, in the nitride semiconductor gate layer 41, a p-type or n-type GaN region 41a having a hole concentration lower than that of the nitride semiconductor gate layer 41 is formed in the surface layer portion of the nitride semiconductor gate layer 41 that is in surface contact with the first metal film 51.

Referring back to FIG. 6, the insulating film 43 is made of, for example, SiO$_2$ and has a thickness of about 100 nm to 300 nm. The insulating film 43 may be made of SiN. Each sidewall 44 is made of, for example, SiN. Each sidewall 44 may be made of SiN, SiO$_2$, SiON, or a composite film thereof. The passivation film 6 covers the surface of the second nitride semiconductor layer 5 (excluding regions where the contact holes 7 and 8 are engaged) and sides and a surface of the gate portion 40. In this embodiment, the passivation film 6 is a SiN film and has a thickness of about 50 nm to 200 nm. The passivation film 6 may be made of SiN, SiO$_2$, SiON, or a composite film thereof.

The source electrode 9 and the drain electrode 10 include, for example, a first metal layer (ohmic metal layer) in contact with the second nitride semiconductor layer 5, a second metal layer (main electrode metal layer) stacked on the first metal layer, a third metal layer (adhesion layer) stacked on the second metal layer, and a fourth metal layer (barrier metal layer) stacked on the third metal layer. The first metal layer is, for example, a Ti layer having a thickness of about 10 nm to 20 nm. The second metal layer is, for example, an Al layer having a thickness of about 100 nm to 300 nm. The third metal layer is, for example, a Ti layer having a thickness of about 10 nm to 20 nm. The fourth metal layer is, for example, a TiN layer having a thickness of about 10 nm to 50 nm.

In this nitride semiconductor device 101, the second nitride semiconductor layer 5 (electron supply layer) having a band gap (Al composition) different from that of the first nitride semiconductor layer 4 (electron transit layer) is formed on the first nitride semiconductor layer 4 to form a heterojunction. As a result, a two-dimensional electron gas 11 is formed in the first nitride semiconductor layer 4 near the interface between the first nitride semiconductor layer 4 and the second nitride semiconductor layer 5, and an HEMT is formed using the two-dimensional electron gas 11 as a channel. The gate electrode 42 faces the second nitride semiconductor layer 5 with the nitride semiconductor gate layer 41 interposed therebetween.

Below the gate electrode 42, the energy levels of the first nitride semiconductor layer 4 and the second nitride semiconductor layer 5 are raised by ionized acceptors included in the nitride semiconductor gate layer 41, which is the p-type GaN layer. Accordingly, the energy level of the conduction band at the heterojunction interface between the first nitride semiconductor layer 4 and the second nitride semiconductor layer 5 becomes higher than the Fermi level. Therefore, a two-dimensional electron gas 11, which is caused by the spontaneous polarization of the first nitride semiconductor layer 4 and the second nitride semiconductor layer 5 and the piezo polarization caused by a lattice mismatch therebetween, is not formed immediately below the gate electrode 42 (the gate portion 40).

Therefore, when bias is not applied to the gate electrode 42 (at the time of zero bias), the channel by the two-dimensional electron gas 11 is cut off immediately below the gate electrode 42. Thus, a normally-off type HEMT is realized. When an appropriate on voltage (for example, 3V) is applied to the gate electrode 42, a channel is induced in the first nitride semiconductor layer 4 immediately below the gate electrode 42 to interconnect the two-dimensional electron gases 11 on both sides of the gate electrode 42. As a result, the source and drain of the HEMT are electrically interconnected.

When in use, for example, a predetermined voltage (e.g., 10V to 500V), which is positive on the drain electrode 10 side, is applied between the source electrode 9 and the drain electrode 10. In this state, an off voltage (0V) or an on voltage (5V) is applied to the gate electrode 42 with the source electrode 9 as a reference potential (0V). FIGS. 8A to 8J are cross-sectional views for explaining an example of a process of manufacturing the above-described nitride semiconductor device 101, and depict cross-sectional structures at a plurality of steps in the manufacturing process.

Figure 8A:
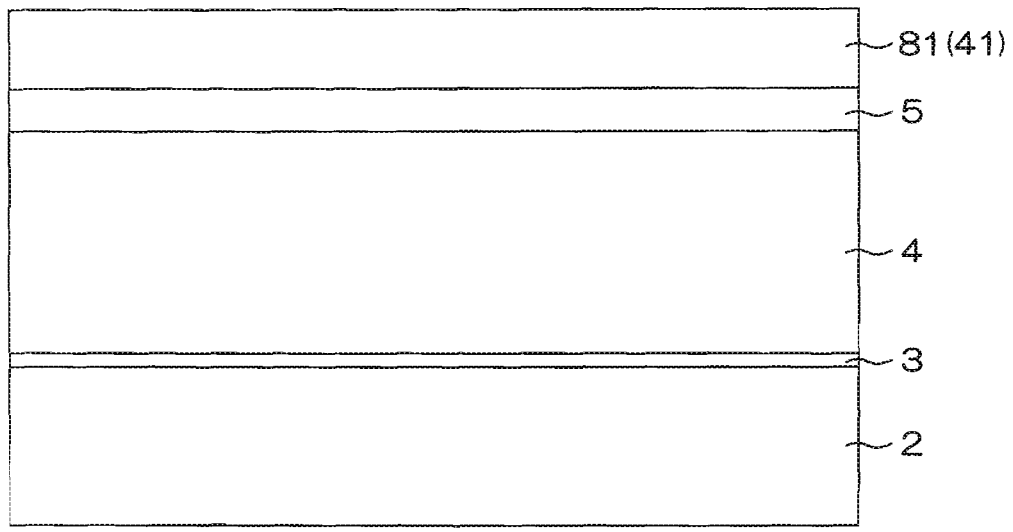
FIG. 8A is a cross-sectional view showing a step in a process of manufacturing the nitride semiconductor device in FIG. 6.
Figure 8B:
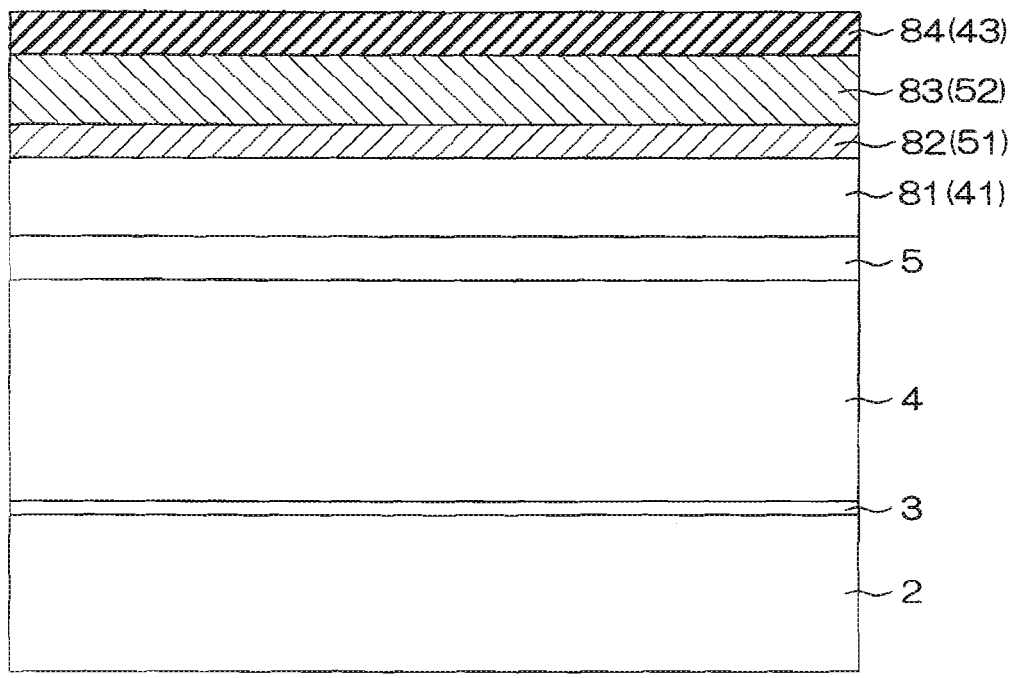
FIG. 8B is a cross-sectional view showing a step subsequent to the step of FIG. 8A.

First, as shown in FIG. 8A, the buffer layer 3, the first nitride semiconductor layer (electron transit layer) 4, and the second nitride semiconductor layer (electron supply layer) 5 are epitaxially grown on the substrate 2 by MOCVD. Further, a gate layer material film 81, which is a material film of the nitride semiconductor gate layer 41, is formed on the second nitride semiconductor layer 5 by MOCVD. Next, as shown in FIG. 8B, a Ti film 82, which is a material film of the first metal film 51, is formed on the gate layer material film 81 by sputtering. Then, a TiN film 83, which is a material film of the second metal film 52, is formed on the Ti film 82. Thereafter, a SiO$_2$ film 84, which is a material film of the insulating film 43, is formed on the TiN film 83 by plasma CVD.

Figure 8C:
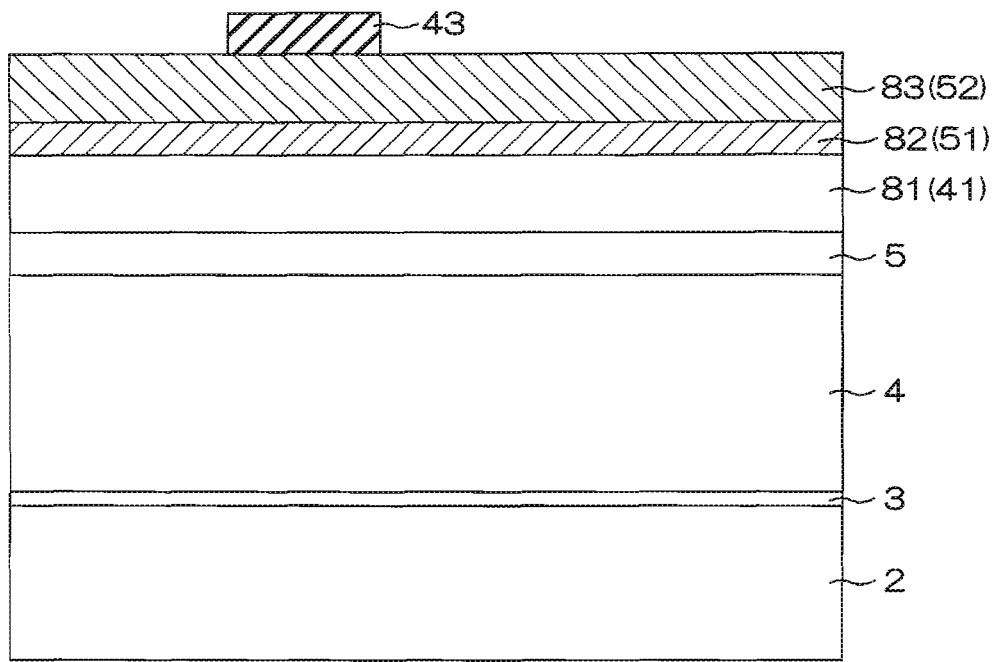
FIG. 8C is a cross-sectional view showing a step subsequent to the step of FIG. 8B.
Figure 8D:
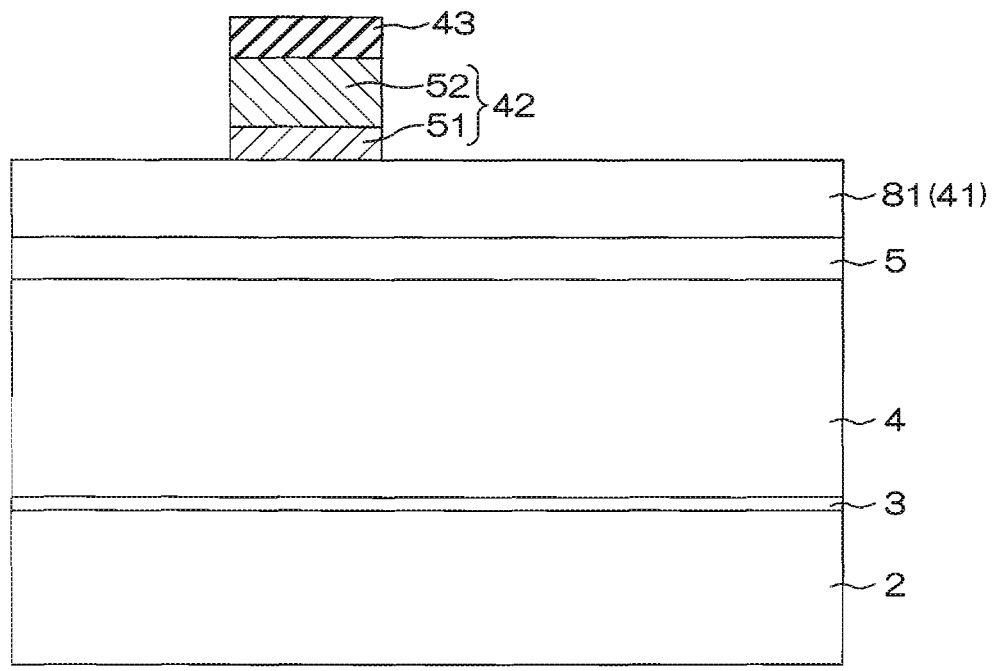
FIG. 8D is a cross-sectional view showing a step subsequent to the step of FIG. 8C.

Next, as shown in FIG. 8C, the SiO$_2$ film 84 is patterned by photolithography and etching. As a result, the insulating film 43 is formed on the TiN film 83 so as to cover a portion of the TiN film 83 that becomes the second metal film 52 (the gate electrode 42). Next, as shown in FIG. 8D, the TiN film 83 and the Ti film 82 are patterned by etching using the insulating film 43 as a mask. In so doing, a stacked body of the gate electrode 42 and the insulating film 43 is formed on the gate layer material film 81. The gate electrode 42 includes the first metal film 51, which is the lower layer, and the second metal film 52, which is the upper layer. At this stage, the first metal film 51 is made of Ti.

Figure 8E:
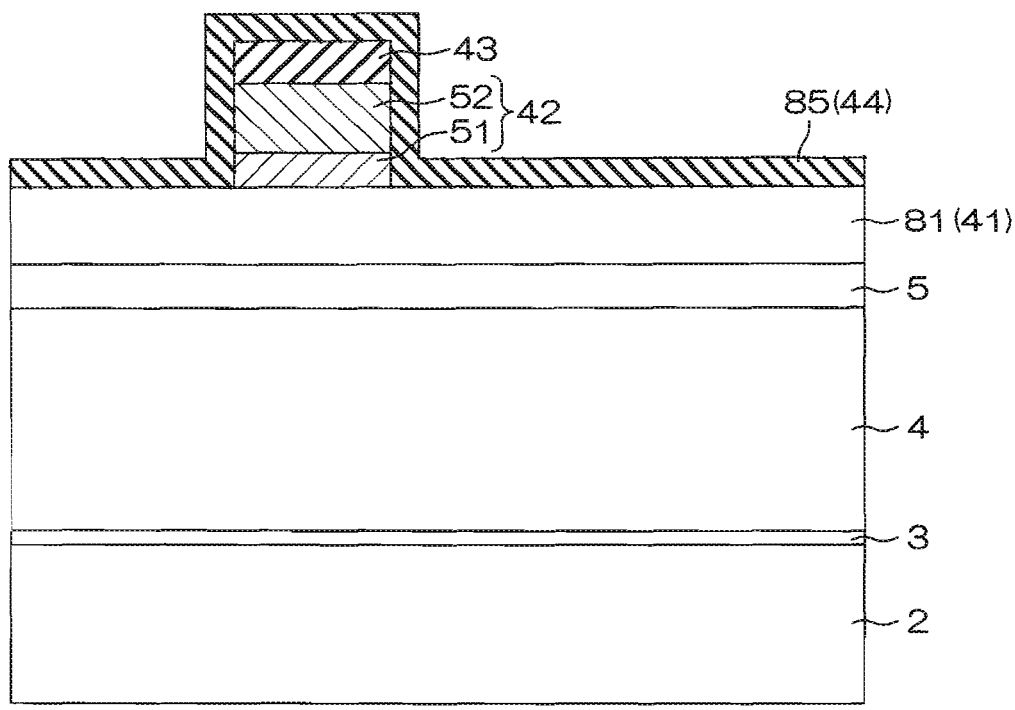
FIG. 8E is a cross-sectional view showing a step subsequent to the step of FIG. 8D.
Figure 8F:
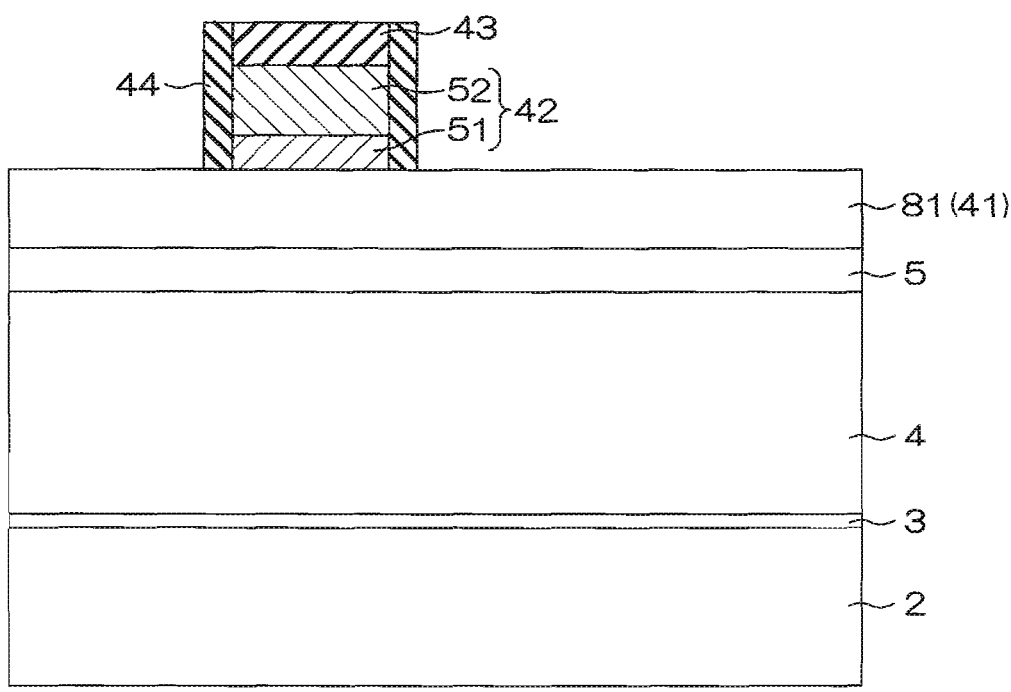
FIG. 8F is a cross-sectional view showing a step subsequent to the step of FIG. 8E.

Next, as shown in FIG. 8E, a SiN film 85, which is a material film of the sidewall 44, is formed so as to cover the entire exposed surface. Next, as shown in FIG. 8F, the sidewall 44 is formed by etching the SiN film 85. Next, as shown in FIG. 8G, the gate layer material film 81 is patterned by etching using the insulating film 43 and the sidewall 44 as a mask. As a result, the gate portion 40 including the nitride semiconductor gate layer 41, the gate electrode 42, the insulating film 43 and the sidewall 44 is formed.

Next, as shown in FIG. 8H, a passivation film 6 is formed so as to cover the entire exposed surface. The passivation film 6 is, for example, made of SiN. Thereafter, an annealing process is performed in a nitrogen atmosphere. Through this annealing step, N in the surface layer portion of the nitride semiconductor gate layer 41 reacts with Ti in the first metal film 51 to form the first region 51A (see FIG. 7) made of TiN in the surface layer portion of the first metal film 51 toward the nitride semiconductor gate layer 41. Therefore, as shown in FIG. 7, the first metal film 51 has the first region 51A made of TiN and the second region 51B made of TiN other than first region 51A.

On the other hand, N is desorbed from the surface layer portion of the nitride semiconductor gate layer 41 due to the formation of TiN by the reaction of N in the surface layer portion of the nitride semiconductor gate layer 41 and Ti of the first metal film 51. In so doing, the surface layer portion of the nitride semiconductor gate layer 41 becomes n-type, and a p-type or n-type GaN region 41a (see FIG. 7) having a hole concentration lower than that of the nitride semiconductor gate layer 21 is formed in the surface layer portion of the nitride semiconductor gate layer 41 toward the first metal film 51. As a result, since the barrier height between the first metal film 51 and the nitride semiconductor gate layer 41 increases, the gate leakage current decreases.

Figure 8I:
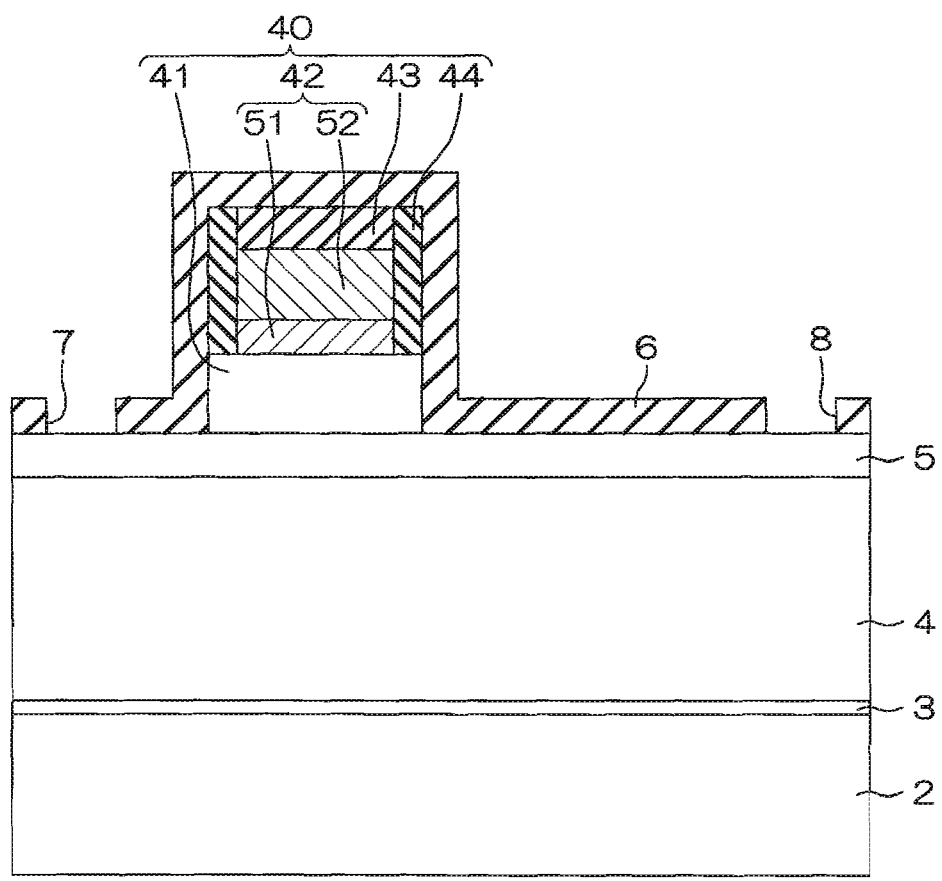
FIG. 8I is a cross-sectional view showing a step subsequent to the step of FIG. 8H.

Next, as shown in FIG. 8I, a source contact hole 7 and a drain contact hole 8 reaching the second nitride semiconductor layer 5 are formed in the passivation film 6. Next, as shown in FIG. 8J, a source/drain electrode film 86 is formed so as to cover the entire exposed surface. Finally, the source/drain electrode film 86 is patterned by photolithography and etching, so as to form a source electrode 14 and a drain electrode 15 that are in ohmic contact with the second nitride semiconductor layer 5. Thus, a nitride semiconductor device 101 having a structure as shown in FIG. 6 is obtained.

In the above-described manufacturing method, the annealing process for making the surface layer portion of the nitride semiconductor gate layer 41 n-type is performed immediately after the passivation film 6 is formed. However, such an annealing process may be performed at any timing after the passivation film 6 is formed. In the above-described second embodiment, the gate electrode 42 is composed of the first metal film 51 formed on the nitride semiconductor gate layer 41 and mainly made of Ti, and the second metal film 52 stacked on the first metal film 51 and made of TiN. Accordingly, as compared with a case where the gate electrode 42 is composed of only a TiN metal film, since the barrier height between the gate electrode 42 and the nitride semiconductor gate layer 41 is increased, the gate leakage current can be reduced.

In addition, in the above-described second embodiment, since the sidewalls 44 are formed on both sides of the upper surface of the nitride semiconductor gate layer 41, the gate electrode 42 is not in contact with both sides of the upper surface of the nitride semiconductor gate layer 41. Accordingly, in the above-described second embodiment, as compared with a case where the gate electrode is in contact with both sides of the upper surface of the nitride semiconductor gate layer 41, a path in which a leakage current flows from the gate electrode 42 to the source electrode 9 through the surface of the nitride semiconductor gate layer 41 can be lengthened. As a result, the gate leakage current can be reduced.

In the above-described second embodiment, the first metal film 51 is mainly made of Ti. However, the first metal film 51 may be made of TiN. When the first metal film 51 is made of TiN, the Ti/N composition ratio of the first metal film 51 may be larger than the Ti/N composition ratio of the second metal film 52. For example, the Ti/N composition ratio of the second metal film 52 is about 1, whereas the Ti/N composition ratio of the first metal film 51 is about 2.

Since the Ti/N composition ratio of the first metal film 51 is larger than the Ti/N composition ratio of the second metal film 52, N in the surface layer portion of the nitride semiconductor gate layer 41 toward the first metal film 51 is drawn to the first metal film 51 in the manufacturing process. Accordingly, a p-type or n-type GaN layer having a hole concentration lower than that of the nitride semiconductor gate layer 41 is easily formed on the surface layer portion of the nitride semiconductor gate layer 41 toward the first metal film 51. Therefore, the gate leakage current can be reduced as compared with a case where the entire gate electrode is made of TiN having the Ti/N composition ratio of the second metal film 52.

Figure 9:
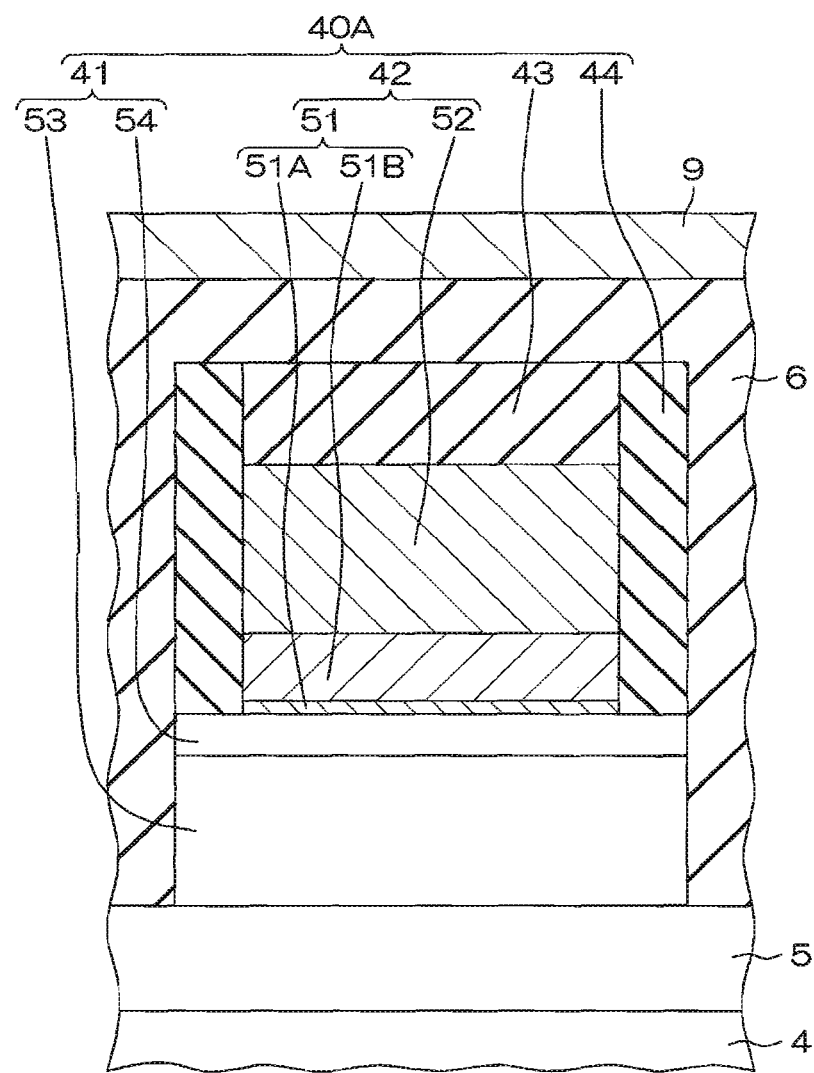
FIG. 9 is a cross-sectional view showing a modification of the gate portion in FIG. 6 that corresponds to FIG. 7.

FIG. 9 is a cross-sectional view showing a modification of the gate portion in FIG. 6 that corresponds to FIG. 7. A gate portion 40A of FIG. 9 is different from the gate portion 40 of FIG. 6 in that the nitride semiconductor gate layer 41 is composed of a third nitride semiconductor layer 53 formed on the second nitride semiconductor layer 5, and a fourth nitride semiconductor layer 54 formed on the third nitride semiconductor layer. The third nitride semiconductor layer 53 is made of a nitride semiconductor doped with an acceptor-type impurity. In this embodiment, the third nitride semiconductor layer 53 is a GaN layer doped with an acceptor-type impurity (p-type GaN layer) and has a thickness of about 50 nm to 100 nm. The concentration of the acceptor-type impurity implanted into the third nitride semiconductor layer 53 may be $1\times10^{19}$ cm$^{-3}$ or more and may be reduced to about $1\times10^{18}$ cm$^{-3}$ near the surface. In this embodiment, the acceptor-type impurity is Mg (magnesium). The acceptor-type impurity may be an acceptor-type impurity other than Mg, such as Zn. The third nitride semiconductor layer 53 is provided to cancel out the two-dimensional electron gas 11 generated in the vicinity of the interface between the first nitride semiconductor layer 4 (electron transit layer) and the second nitride semiconductor layer 5 (electron supply layer) at a region immediately below the gate portion 40A.

The fourth nitride semiconductor layer 54 is made of a nitride semiconductor doped with a donor-type impurity. In this embodiment, the fourth nitride semiconductor layer 54 is a GaN layer doped with a donor-type impurity (n-type GaN layer) and has a thickness of ¹⁄₁₀ or less of the thickness of the third nitride semiconductor layer 53. The concentration of the donor-type impurity implanted into the fourth nitride semiconductor layer 54 may be, for example, $2\times10^{18}$ cm$^{-3}$ or more. In this embodiment, the acceptor-type impurity is Si (silicon). The fourth nitride semiconductor layer 54 is provided to increase the barrier height between the nitride semiconductor gate layer 21 and the gate electrode 42 to reduce the gate leakage current. As a result, even in this modified embodiment, the gate leakage current can be decreased.

Even in the gate portion 40A of FIG. 9, in the manufacturing process, N in the surface layer portion of the fourth nitride semiconductor layer 54 and Ti in the first metal film 51 react with each other to form TiN in the surface layer portion of the first metal film 51 which faces the fourth nitride semiconductor layer 54. Accordingly, the first metal film 51 has a first region 51A made of TiN and a second region 51B made of Ti other than the first region 51A in the surface layer portion toward the nitride semiconductor gate layer 41.

In the gate portion 40A of FIG. 9, the first metal film 51 is mainly made of Ti. However, the first metal film 51 may be made of TiN. When the first metal film 51 is made of TiN, the Ti/N composition ratio of the first metal film 51 may be larger than the Ti/N composition ratio of the second metal film 52. For example, the Ti/N composition ratio of the second metal film 52 is about 1, whereas the Ti/N composition ratio of the first metal film 51 is about 2.

Some embodiments of the present disclosure have been described above. However, the present disclosure can also be implemented with other embodiments. For example, in the above-described embodiments, silicon is exemplified as a material example of the substrate 2, but any other substrate materials such as a sapphire substrate and a GaN substrate may be applicable. Other various design changes can be made within the scope of matters described in the claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device comprising:
    a first nitride semiconductor layer configured as an electron transit layer;
    a second nitride semiconductor layer formed on the first nitride semiconductor layer and configured as an electron supply layer;
    a source electrode;
    a drain electrode;
    a ridge-shaped nitride semiconductor gate layer disposed on the second nitride semiconductor layer and including an acceptor-type impurity;

a gate electrode formed on the nitride semiconductor gate layer and configured to control electric conduction between the source electrode and the drain electrode; and a pair of first dielectric films formed on both sides of an upper surface of the nitride semiconductor gate layer, wherein the gate electrode includes a first metal film that is formed on the nitride semiconductor gate layer and is mainly made of Ti, and a second metal film that is formed on the first metal film and is made of TiN, and wherein the first metal film is formed so as to cover a portion of the upper surface between the pair of first dielectric films on the nitride semiconductor gate layer, and upper surface and side surfaces of the pair of first dielectric films, which face each other.

2. A nitride semiconductor device comprising:

a first nitride semiconductor layer configured as an electron transit layer;

a second nitride semiconductor layer formed on the first nitride semiconductor layer and configured as an electron supply layer;

a source electrode;

a drain electrode;

a ridge-shaped nitride semiconductor gate layer disposed on the second nitride semiconductor layer;

a gate electrode formed on the nitride semiconductor gate layer and configured to control electric conduction between the source electrode and the drain electrode; and a pair of first dielectric films formed on both sides of an upper surface of the nitride semiconductor gate layer, wherein the gate electrode includes a first metal film that is formed on the nitride semiconductor gate layer and is made of TiN, and a second metal film that is stacked on the first metal film and is made of TiN, and wherein a Ti/N composition ratio of the first metal film is larger than a Ti/N composition ratio of the second metal film, and wherein the first metal film is formed so as to cover a portion of the upper surface between the pair of first dielectric films on the nitride semiconductor gate layer, and an upper surface and side surfaces of the pair of first dielectric films, which face each other.

3. The nitride semiconductor device of claim 1, wherein the nitride semiconductor gate layer comprises only a third nitride semiconductor layer containing an acceptor-type impurity.

4. The nitride semiconductor device of claim 1, wherein the nitride semiconductor gate layer includes a third nitride semiconductor layer that is formed on the second nitride semiconductor layer and contains an acceptor-type impurity, and a fourth nitride semiconductor layer that is stacked on the third nitride semiconductor layer and has a hole concentration lower than a hole concentration of the third nitride semiconductor layer.

5. The nitride semiconductor device of claim 4, wherein the fourth nitride semiconductor layer contains a donor-type impurity.

6. The nitride semiconductor device of claim 1, further comprising:

a pair of first dielectric films formed on both sides of an upper surface of the nitride semiconductor gate layer, wherein the first metal film is interposed between the pair of first dielectric films, and wherein a lower surface of the first metal film is in contact with a portion of the upper surface between the pair of first dielectric films on the nitride semiconductor gate layer, and a side surface of the first metal film is covered with the pair of first dielectric films.

7. The nitride semiconductor device of claim 1, further comprising:

a second dielectric film that covers at least a side surface of the nitride semiconductor gate layer and a side surface the pair of first dielectric films.

8. The nitride semiconductor device of claim 1, wherein the pair of first dielectric films is SiN, SiO2, SiON or a composite layer thereof.

9. The nitride semiconductor device of claim 7, wherein the pair of first dielectric films is SiN, SiO2, SiON, or a composite layer thereof, and the second dielectric film is SiN, SiO2, SiON, or a composite layer thereof.

10. The nitride semiconductor device of claim 1, wherein the first metal film has a first region made of TiN, which is a surface layer portion on the nitride semiconductor gate layer side, and a second region made of Ti other than the first region.

11. The nitride semiconductor device of claim 10, wherein a Ti/N composition ratio of the first region is larger than a Ti/N composition ratio of the second metal film.

* * * * *